(12) United States Patent
Kita et al.

(10) Patent No.: US 11,476,427 B2
(45) Date of Patent: Oct. 18, 2022

(54) π-CONJUGATED BORON COMPOUND, ELECTRONIC DEVICE, AND METHODS RESPECTIVELY FOR PRODUCING TRIARYLBORANE AND INTERMEDIATE THEREOF

(71) Applicants: Konica Minolta, Inc., Tokyo (JP); Tohoku University, Miyagi (JP)

(72) Inventors: Hiroshi Kita, Hachioji (JP); Takayuki Iijima, Fukuroi (JP); Shuichi Oi, Sendai (JP); Yuichi Kitamoto, Sendai (JP)

(73) Assignees: KONICA MINOLTA, INC., Tokyo (JP); TOHOKU UNIVERSITY, Miyagi (JP)

( * ) Notice: Subject to any disclaimer, the term of this patent is extended or adjusted under 35 U.S.C. 154(b) by 765 days.

(21) Appl. No.: 16/086,939

(22) PCT Filed: Mar. 17, 2017

(86) PCT No.: PCT/JP2017/010825
§ 371 (c)(1),
(2) Date: Sep. 20, 2018

(87) PCT Pub. No.: WO2017/164093
PCT Pub. Date: Sep. 28, 2017

(65) Prior Publication Data
US 2019/0386220 A1     Dec. 19, 2019

(30) Foreign Application Priority Data
Mar. 23, 2016 (JP) .............................. JP2016-058504

(51) Int. Cl.
*H01L 51/00* (2006.01)
*C07F 5/02* (2006.01)
*H01L 51/05* (2006.01)

(52) U.S. Cl.
CPC ............ *H01L 51/008* (2013.01); *C07F 5/027* (2013.01); *H01L 51/0529* (2013.01)

(58) Field of Classification Search
CPC ...... C07F 5/027; C09K 11/06; H01L 51/0078; H01L 51/008; H01L 51/0085;
(Continued)

(56) References Cited

U.S. PATENT DOCUMENTS 10,301,328 B2 * 5/2019 Lu ..................... H01L 51/0071
2018/0366653 A1 * 12/2018 He ..................... H01L 51/0072

FOREIGN PATENT DOCUMENTS

CN    107925006 A      4/2018
CN    106467553 B  *   8/2019
(Continued)

OTHER PUBLICATIONS

Saito et al., J. Am. Chem. Soc., (2012), 134, pp. 9130-9133 (Year: 2012).*
(Continued)

*Primary Examiner* — Dawn L Garrett
(74) *Attorney, Agent, or Firm* — Lucas & Mercanti, LLP

(57) ABSTRACT

There are provided a π-conjugated boron compound, an electronic device containing an organic functional layer including the π-conjugated boron compound, a method for producing a triarylborane, and a method for producing a triarylborane intermediate. In the π-conjugated boron compound, a boron atom is bonded to three aromatic groups via three boron-carbon bonds. Bond distances of the three boron-carbon bonds are all 1.48 Å or less.

4 Claims, 10 Drawing Sheets

(58) Field of Classification Search
CPC ............. H01L 51/0529; H01L 51/0558; H01L 51/4253; H01L 51/5012; H01L 51/5056; H01L 51/5072

See application file for complete search history.

(56) References Cited

FOREIGN PATENT DOCUMENTS

| JP | 2011057990 A | 3/2011 |
|---|---|---|
| JP | 2017126606 A | 7/2017 |
| JP | 6729589 B2 | 7/2020 |
| WO | 2017018326 A1 | 2/2017 |

OTHER PUBLICATIONS

Hashimoto, Sigma "Syntheses of Polycyclic Aromatic Compounds with Heteroatom Junctions via Tandem Hetero-Friedel Crafts Reactions" (Dissertation), Kyoto University, Issue Date Mar. 25, 2013 (Year: 2013).*

Escande et al, Chem. Commun., (2015), vol. 51, pp. 6257-6274 (Year: 2015).*

Wood et al., Angew. Chem., Int. Ed., (2009), vol. 48, pp. 4009-4012. (Year: 2009).*

Wood et al., Chem.-Eur. J., (2010), vol. 16, pp. 12199-12206. (Year: 2010).*

Agou et al., Chem.-Eur. J., (2009), vol. 15, pp. 5056-5062. (Year: 2009).*

Melaimi et al., Inorg. Chem., (2006), vol. 45, pp. 8136-8143. (Year: 2006).*

Matsumoto et al., Organometallics, (2010), vol. 29, pp. 5490-5495. (Year: 2010).*

"Trifluoromethanesulfonate." National Center for Biotechnology Information. PubChem Compound Database, U.S. National Library of Medicine, https://pubchem.ncbi.nlm.nih.gov/compound/Trifluoromethanesulfonate. (Year: 2021).*

KIPO, Office Action for the corresponding Korean patent application No. 10-2018-7026821, dated May 28, 2020, with English translation.

CNIPA, Office Action for the corresponding Chinese patent application No. 201780019281.7, dated Mar. 30, 2020, with English translation (14 pages).

Written Opinion of the International Searching Authority dated Jun. 6, 2017 from corresponding International Application No. PCT/JP2017/010825 and English translation.

KIPO, Office Action for the corresponding Korean patent application No. 10-2018-7026821, dated Nov. 25, 2019, with English translation (9 pages).

JPO, Office Action for the corresponding Japanese patent application No. 2018-507294, dated Oct. 27, 2020, with English translation.

K. Matsuo, et al; Photodissociation of B—N Lewis Adducts: a partially fused trinaphthylborane with dual fluorescence; Journal of American Chemical Society; 2014; 136; pp. 12580-12583.

M. Kinoshita, et al; A novel family of boron-containing hole-blocking amorphous molecular materials for blue and blue violet emitting . . . ; Advanced Functional Materials; Dec. 2002; 12; No. 11-12; pp. 780-786.

Z. Zhou, et al; Planarized trirylboranes: Stabilization by structural constraint and their plane to bowl conversion; Journal of American Chemical Society; 2012; 134; pp. 4529-4532.

H. Hirai, et al; Synthesis of phenoxaborine analogs as materials for organic electroluminescence; The Chemical Society of Japan; 2015; 3D3-04; 1 page.

H. Hirai, et al; One step borylation of 1,3-diaryloxybenzenes towards efficient materials for organic light-emitting diodes; Angew. Chem. Int. Ed.; 2015; 54; pp. 13581-13585.

T.B. Tai, et al; Theoretical design of pi-conjugated heteropolycyclic compounds containing a tricoordinated boron center; Journal of Physical Chemistry; 2013; 117; pp. 14999-15008.

Y. Kitamoto, et al; The first synthesis of x-ray crystallographic analysis of an oxygen-bridged planarized triphenylborane; Chem. Commun.; 2016; 52; pp. 7098-7101.

International Search Report dated Jun. 6, 2017 for PCT/JP2017/010825 and English translation.

Office Action for the corresponding Japanese patent application No. 2020-218438, dated Nov. 30, 2021, with English translation.

* cited by examiner

Torsion angle : C1-B-C2-C3 = 21.74 °

Torsion angle : C1-B-C4-C5 = 12.12 °

Torsion angle : C5-C4-O-C6 = 16.36 °

B3a

B-C: 1.519-1.520 Å

B4b

B-C: 1.527-1.557 Å side view
plane-A plane-B plane-A···plane-B

Distance: 3.374 Å

π-CONJUGATED BORON COMPOUND, ELECTRONIC DEVICE, AND METHODS RESPECTIVELY FOR PRODUCING TRIARYLBORANE AND INTERMEDIATE THEREOF

CROSS REFERENCE TO RELATED APPLICATION

This Application is a 371 of PCT/JP2017/010825 filed on Mar. 17, 2017 which, in turn, claimed the priority of Japanese Patent Application No. 2016-058504 filed on Mar. 23, 2016, both applications are incorporated herein by reference.

TECHNOLOGICAL FIELD

The present invention relates to a π-conjugated boron compound, an electronic device, and methods for producing a triarylborane and an intermediate thereof. More specifically, the present invention relates to a novel π-conjugated boron compound in which bonds between a boron atom and carbon atoms are strengthened. The present invention further relates to an electronic device having the π-conjugated boron compound in an organic functional layer and having high resistance and excellent electron conductivity, and methods for producing a triarylborane and an intermediate thereof.

DESCRIPTION OF THE RELATED ART

Hereinafter, a π-conjugated boron compound according to the present invention is described in detail.
<<Characteristics of Organic Compound Including Boron Atom>>
<Electronic Effect>

Boron atom is an element with atomic number 5 belonging to Group IIIb in the periodic table of elements, and has a trivalent valence. The electron configuration in an atomic state is given by $(1s)^2$, $(2s)^2$, $(2p)^1$. Using one 2s orbital and two 2p orbitals, $sp^2$ hybrid orbital can be formed. Equivalent electrons (a total of three electrons) are arranged one by one at the three $sp^2$ orbitals, so that covalent bonds can be formed with elements such as carbon, oxygen, and nitrogen. The boron atom can be therefore regarded as a trivalent substituent. Meanwhile, since there is one remaining empty 2p orbital, the boron-containing compound is naturally an electron deficient molecule.

Therefore, electron deficiency of this boron atom basically remains in a π-conjugated boron compound in which a boron atom is bonded to three aromatic groups via boron-carbon bonds. The π-conjugated boron compound easily accepts electrons, that is, has a deep LUMO (lowest unoccupied molecular orbital) compared to the vacuum level. Such an electron-accepting compound easily forms a radical anion and moves electrons between molecules with hopping. The basic characteristic of this interesting element and compound can be valuably utilized as detailed below, so that various industrial utilization values come out.

In terms of molecular stability, considering triphenylborane, which is the simplest example, all three bonds of boron atom and phenyl groups, which are $sp^2$ bonds, keep an angle of 120° and form a planar structure. Since there is an empty 2p orbital in the direction orthogonal to the plane of triphenylborane in such a case, the triphenylborane has the property of Lewis acid, which is easily attacked by Lewis bases and nucleophilic species and is stabilized by forming a borate. In such a case, the bonds between the boron atom and the phenyl groups form an SP3 orbital and thereby a borate having a regular tetrahedral structure is formed.

Because this is the fundamental reason why triphenylborane cannot stably exist, triphenylborane can be stabilized by substitution with what can donate electrons to boron in the molecule by through-bond or through-space (see Non-Patent Document 1 and Patent Document 1).
<Steric Effects>

A triarylborane can form a π-conjugated system merely by forming a single bond with an aryl group, and can exhibit effective electron withdrawing property using an empty p orbital. The biggest problem of for the triarylborane is that it has low resistance to nucleophilic species and Lewis base as explained for the triphenylborane. This affects stability in air and decomposition in the presence of water and a base, and hinders practical use for electronic devices which are forced to be used under severe conditions.

In order to solve this problem, there is known a method of stopping the attack by a nucleophilic species or a Lewis base by providing a sterically bulking alkyl group or aryl group around the boron atom of the triarylborane. For example, a borate having an $sp^2$ orbital substituted with three aryl groups (Ar) can be attacked by a Lewis base (denoted herein as Nu-). In such a case, when the aryl groups are aryl groups ($Ar_1$) having low steric hindrance as shown below, $sp^3$ orbital can be formed (reaction B) under attack by the Lewis base Nu-. However, when the aryl groups are aryl groups ($Ar_2$) having high steric hindrance, it is difficult to form $sp^3$ orbital (reaction A). This is a characteristic of reactivity due to the empty p orbital peculiar to the triarylborane.

[Chem 1]

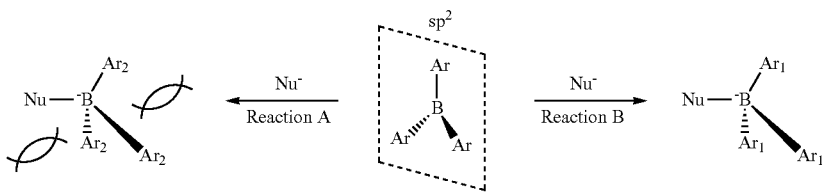

For example, sterically hindered triphenylboranes of Kinoshita et al are known as electron transporting materials and luminescent materials for organic EL (see Non-Patent Document 2). These compounds are also characterized in that they form a thin film having suitable charge mobility in an organic EL element in which uniform electric field intensity is desired to be maintained over the entire surface because of the steric bulkiness around the boron atom which not only suppress the reaction but results in highly amorphous compounds when a thin film is formed only with the compounds.

However, only by the electronic and steric stabilization effects described above, triarylboranes cannot be practically used for electronic devices. This is because stability is still insufficient For improving stability, a planarized triphenylborane compound (a planarized triphenylborane B3a) in which three phenyl groups of triphenylborane are connected by carbon atoms was synthesized and published in 2012 by a group of Yamaguchi et al. (Non-patent Document 3).

[Chem 2]

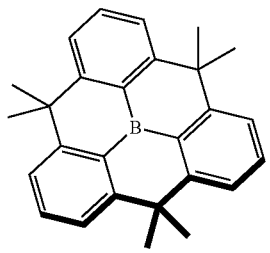

B3a

According to X-ray crystal structure analysis, as illustrated in FIG. 6, this compound has an edge-to-herringbone structure in which a triphenylborane moiety is completely flat and methyl groups are present above and below the plane. This planar structure is therefore robust and does not react so easily even if a nucleophilic species etc. facilitates the boron to form $sp^3$. As a result, molecular stability is enhanced.

Although the planarized triphenylborane compound B3a has a simple chemical structure, its synthesis method is devised as shown in Scheme 1 and requires an advanced synthesis technique.

Scheme 1

[Chem 4]

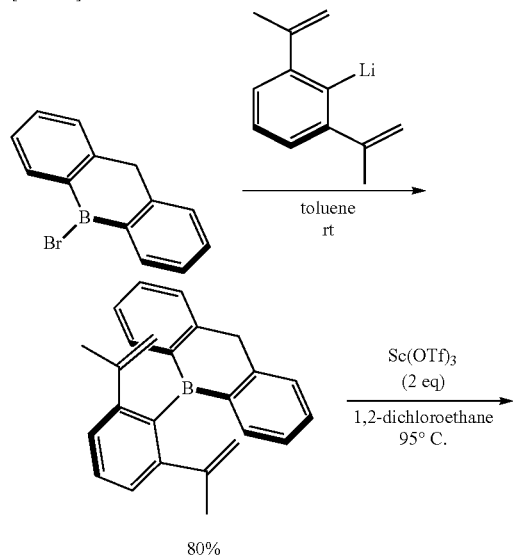

80%

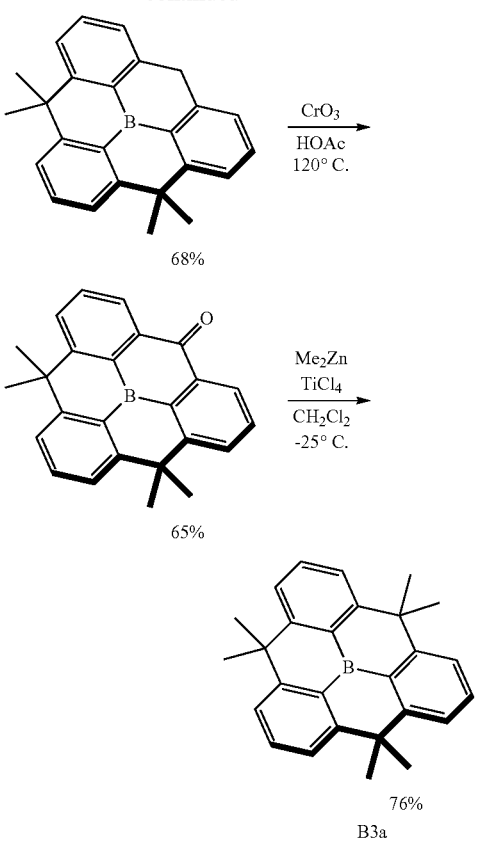

As shown in Scheme 1, synthesis of this compound requires multiple Friedel-Crafts reactions simultaneously in a molecule and the alkylation reaction using dimethylzinc is required for the third methylene moiety after chromic acid oxidation. Therefore, it cannot be denied that the synthesis of this analog is considerably difficult. From the viewpoint of synthetic design and compound synthesis, it has to be said that it is poorly developable.

Apart from this, efforts have been made to stabilize molecules by enhancing planarity while donating π electrons on boron.

Hatakeyama's group have developed a molecule B4a in which two phenoxaborin skeletons overlap using a double intramolecular cyclization reaction as described in the following Scheme 2 (see Non-Patent Documents 4 and 5.).

Scheme 2

[Chem. 5]

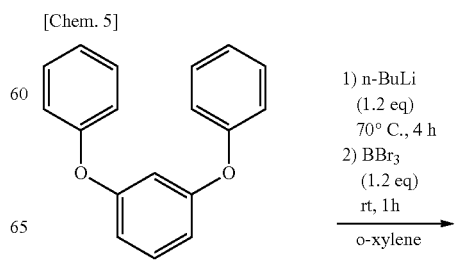

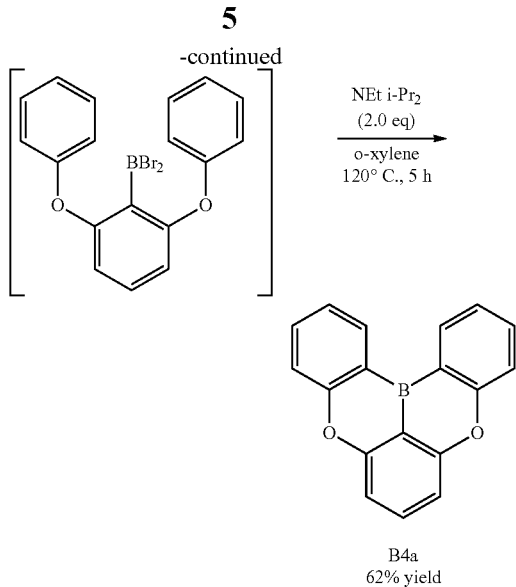

B4a
62% yield

This double phenoxaborin compound B4a is not completely flat, but has improved stability of molecule due to π electron injected from the conjugated oxygen atom. The ether oxygen of the molecule is not only a linking group but also a group that can impart stability, unlike the alkylene of B3a.

Further, it is possible to introduce a substituent from a phenol derivative to this analogue of B4a and to halogenate the B4a itself. Therefore, molecular design of this analogue of B4a can be more flexible than that of the triphenylborane B3a planarized with three methylene groups. It has been reported that molecules having two phenyl groups as substituents in B4a can be suitably used as host compounds of a green phosphorescent organic EL.

In pursuing such stabilization methods, it is easily associated that the triple phenoxaborin structure further having a bridge structure with oxygen at the ring-opening portion of B4a has the best chemical stability. Although physical property of such a compound actually predicted by chemical calculation has already been reported (see Non-Patent Document 6), it is highly difficult to synthesize the compound. We have also devised a number of conceivable synthetic routes to synthesize this compound so far and actually performed synthetization and study, but could not obtain the triple phenoxaborin compound by a system developed from conventionally known methods after all.

PRIOR ART DOCUMENT

Patent Document

[Patent Document 1] Japanese Patent Application Laid Open Publication No. 2011-057990

Non-Patent Document

[Non-Patent Document 1] J. Am. Chem. Soc., 2014, 136 (36), pp12580-12583.
[Non-Patent Document 2] Adv. Funct. Meter., 12 (11_12), 780 (2002) [Non-Patent Document 3] Z. Zhou, A. Wakamiya, T. Kushida, S. Yamaguchi; J. Am. Chem. Soc., 2012, 134, 4529.
[Non-Patent Document 4] Hatakeyama: 95th Annual Meeting of the Chemical Society of Japan in spring, 3D3-04.
[Non-Patent Document 5] Hatakeyama: Angew Chem Int Ed Engl 2015 Nov 18; 54(46): 13581-5. Epub 2015 Sep 18.
[Non-Patent Document 6] J. Phys. Chem. C 2013, 117, 14999-15008

SUMMARY

Problems to be Solved by the Invention

The present invention was achieved based on the above-described problems and situations. The problem to be solved by the present invention is to provide a novel π-conjugated boron compound in which a bond between a boron atom and a carbon atom is strengthened, further to provide an electronic device having the π-conjugated boron compound in an organic functional layer and having high resistance and high electron conductivity, such as an organic elecreoluminescent element, photoelectric conversion device, and a thin film transistor, and to provide methods for producing a triarylborane and an intermediate thereof.

Means for Solving the Problem

The present inventor, who has conducted extensive research about the causes of the problems to solve the problems, has found that a boron compound is stable when it is a π-conjugated boron compound in which a boron atom is bonded to three aromatic groups via three boron-carbon bonds, and bond distances of the three boron-carbon bonds are all 1.48 Å or less. Furthermore, we have designed synthetic routes via synthetic intermediates which are completely different from the conventional ones. As a result of intensive studies on it, the inventors succeeded in synthesizing a triarylborane having this specific chemical structural feature for the first time in the world, and this was the driving force to complete the present invention.

To solve at least one of the problems, one aspect of the present invention is
a π-conjugated boron compound in which a boron atom is bonded to three aromatic groups via three boron-carbon bonds, wherein bond distances of the three boron-carbon bonds are all 1.48 Å or less.

Another aspect is an electronic device including an organic functional layer including the n-conjugated boron compound Another aspect is a method for producing a triarylborane to produce the triarylborane, in which a triarylborane having a structure represented by following Formula (3) is produced using a triarylborane intermediate having a structure represented by following Formula (2):

[Chem 7]

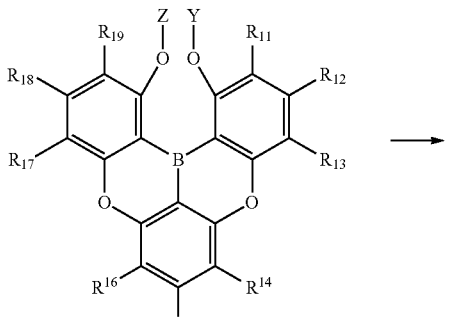

Formula (2)

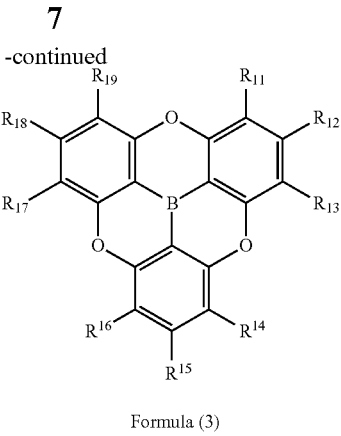

Formula (3)

(in Formula (2) and Formula (3), Y and Z each independently represent a protecting group which is a hydrogen atom, a methyl group, or a hydroxy group; and R11 to R19 each independently represent a hydrogen atom, a chain alkyl group, a ring alkyl group, an alkoxy group, an aryloxy group, an ester group, a cyano group, an alkylamino group, an arylamino group, an aromatic hydrocarbon ring group, or an aromatic heterocyclic group.).

Another aspect is a method for producing a triarylborane intermediate, in which the triarylborane intermediate represented by following Formula (5) is produced using a compound having a structure represented by following Formula (4):

[Chem 8]

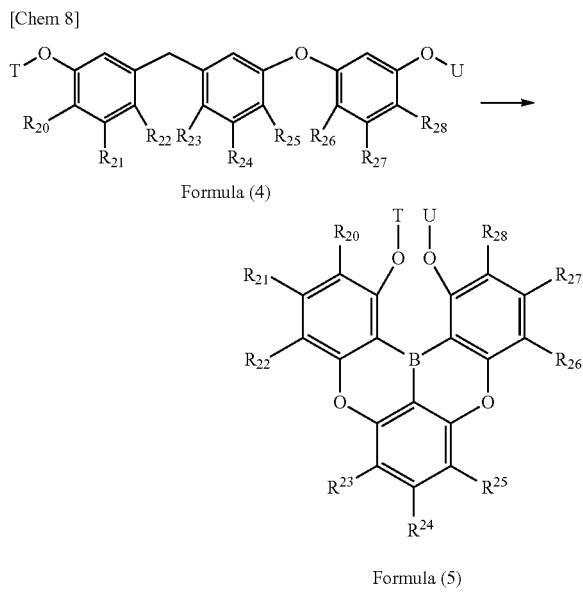

Formula (4)

Formula (5)

(in Formula (4) and Formula (5), T and U each independently represent a protecting group which is a hydrogen atom, a methyl group, or a hydroxy group; and R20 to R28 each independently represent a hydrogen atom, a chain alkyl group, a ring alkyl group, an alkoxy group, an aryloxy group, an ester group, a cyano group, an alkylamino group, an arylamino group, an aromatic hydrocarbon ring group, or an aromatic heterocyclic group.).

BRIEF DESCRIPTION OF THE DRAWINGS

The advantages and features provided by one or more embodiments of the invention will become more fully understood from the detailed description given hereinbelow and the appended drawings which are given by way of illustration only, and thus are not intended as a definition of the limits of the present invention.

DETAILED DESCRIPTION OF EMBODIMENTS

Figure 1:
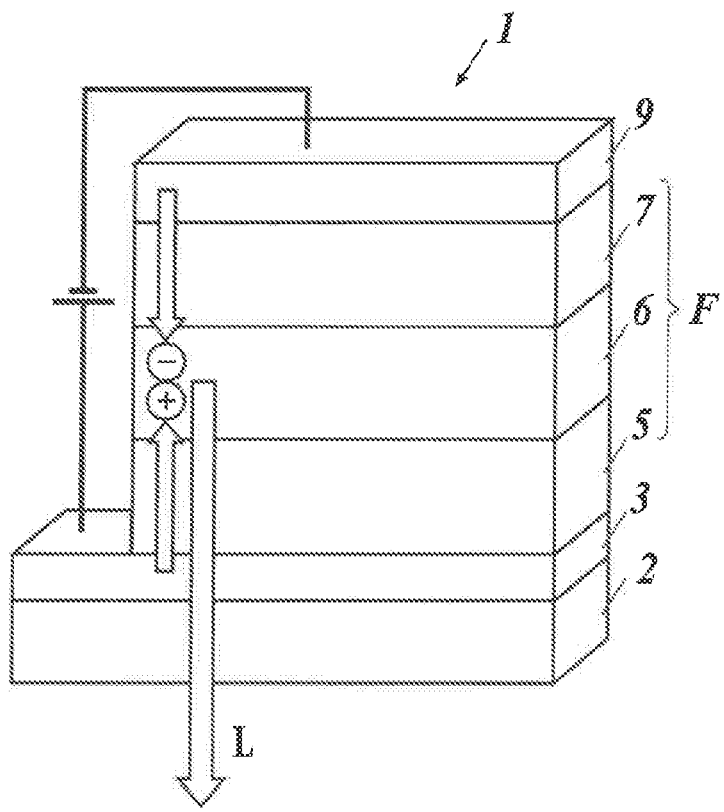
FIG. 1 A schematic view of an exemplary configuration of an organic EL element

Hereinafter, one or more embodiments of the present invention will be described with reference to the drawings. However, the scope of the invention is not limited to the disclosed embodiments.

According to one embodiment of the present invention, there is provided a novel π-conjugated boron compound in which a bond between a boron atom and a carbon atom is strengthened. There is further provided an electronic device having the π-conjugated boron compound in an organic functional layer and having high resistance and high electron conductivity, such as an organic elecreoluminescent element, photoelectric conversion device, and a thin film transistor. There is further provided methods for producing a triarylborane and an intermediate thereof.

The technical features and the mechanism of the effects of the present invention are not clearly understood but presumed as follows.

In the π-conjugated boron compound of the present invention, the bond distance between the boron atom and the carbon atom is short. This strengthens the sp2 property of the boron-carbon bond, which results in strong planarity of the triarylborane so that it is difficult to form an sp3 orbital. Therefore, it is considered that a boron atom will not be attacked by a nucleophilic species or a Lewis base, and that the thermal and electrochemical stability of the molecule will be strengthened.

This property is considered to be strengthened by an electron donating effect to the boron atom from a lone pair of electrons of a hetero atom such as an oxygen atom which exists around the boron atom. The distances of the boron-carbon bonds can be shortened by the strengthened boron-carbon bonds.

The π-conjugated boron compound according to the present invention is characterized in that it is a π-conjugated boron compound in which a boron atom is bonded to three aromatic groups via three boron-carbon bonds, and bond distances of the three boron-carbon bonds are all 1.48 Å or less. This feature is a technical feature common to or corresponding to the inventions according to the respective claims.

As an embodiment of the present invention, from the viewpoint of exhibiting the effect of the present invention, it is preferable that bond distances of the boron-carbon bonds are all in a range of 1.45 to 1.47 Å. Further, it is preferable from the viewpoint of effective electron conductivity that the π-conjugated boron compound is a triarylborane having a boron atom bonded to three aryl groups, wherein the three aryl groups are present on a same plane.

Further, in the present invention, it is preferable that the triarylborane has a disk-like structure in which hetero atoms link adjacent positions of carbon atoms which are in the three aryl groups and bonded to the boron atom. This results in a stronger carbon-boron bond.

Further, it is preferable that the triarylborane has a structure represented by the Formula (1).

As an embodiment of the present invention, an electronic device including an organic functional layer including the π-conjugated boron compound is preferred. An organic electroluminescence element, a photoelectric conversion device, or a thin film transistor is further preferred because compounds having excellent electron conductivity can be used.

Further, as a method for producing a triarylborane to produce the triarylborane, it is preferable that a triarylborane having a structure represented by the Formula (3) is produced using a triarylborane intermediate having a structure represented by the Formula (2). Further, in the method for producing a triarylborane, it is preferable that, in the Formula (2), Y represents a hydrogen atom and Z represents a trifluoromethanesulfonate group. Further, it is preferable that in the producing method, the triarylborane intermediate represented by the Formula (5) is produced using the compound having a structure represented by the Formula (4). Further, it is preferable that, in the Formula (4) and Formula (5), T and U both represent a methyl group.

The components of the present invention and embodiments and aspects for implementing the present invention will now be described in detail. The term "to" used in the present application indicates that the numeric values before and after the term are inclusive as the lower limit value and the upper limit value, respectively.

[π-Conjugated Boron Compound]

The π-conjugated boron compound according to the present invention is a π-conjugated boron compound in which a boron atom is bonded to three aromatic groups via three boron-carbon bonds, wherein bond distances of the three boron-carbon bonds are all 1.48 Å or less.

The π-conjugated boron compound having such a structure is extremely stable because the boron-carbon bond is strengthened with respect to the conventional boron compound. In particular, when used in an organic functional layer of an electronic device, it exhibits extremely high durability and extremely high electron conductivity.

<<Difference From Existing Triarylboranes>>

Next, with reference to a triarylborane having strengthened bonds between the boron atom and the carbon atoms which forms the fundamental basis of the present invention, properties of the triarylborane will be explained from the inherent physical properties of the compound.

<Bond Distance of Boron-Carbon Bond>

The greatest property of the present invention is that the bond distance between the boron atom and the carbon atoms are short in the triarylborane of the present invention, which results in strong sp$^2$ property of the boron-carbon bond. The planarity of the triarylborane is thereby strengthened, which makes it less likely to form an sp$^3$ orbital, so that the boron atoms will not be attacked by nucleophiles or Lewis bases. As a result, the thermal and electrochemical stability of the molecule are enhanced Since the effect is remarkable when the boron-carbon distance is 1.48 Å or less, it can be said that they are general properties of triarylboranes. Up to now, all bond distances of the boron-carbon bonds exceed 1.48 Å in triarylboranes when they are single bonds between the boron atom and the carbon atoms. Therefore, the present invention is revolutionary and frontier, and such short-bond-distance triarylborane, which will be discovered in the future, should also be included in the present invention.

The distances of boron-carbon bonds in triarylboranes and analogues thereof which have been found prior to the present invention and subjected to measurement by structural analysis using X-ray diffraction, are summarized below.

[Chem 9]

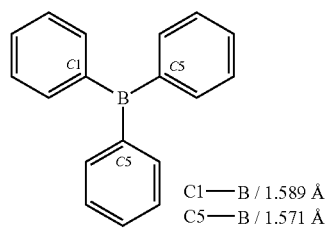

C1—B / 1.589 Å
C5—B / 1.571 Å

C1—B / 1.580 Å
C5—B / 1.573 Å

The triphenylborane (B1) is the simplest triarylborane and has bond distances of 1.571 to 1.589 Å (see Zettler, F.; Hausen, H. D.; Hess, H.; J. Organomet. Chem., 1974, 72, 157). The bond distances of thermally stable trimesitylborane (B2) are 1.573 to 1.580 Å (see Blount, J. F.; Finocchiaro, p.; Gust, D.; Mislow, k j.; J. Am. Chem. Soc. 1973, 95, 7019).

[Chem 10]

C1—B / 1.545 Å
C2—B / 1.547 Å
C3—B / 1.580 Å

Next, B6 in which the 2-position (ortho-position) of the two phenyl groups of the triphenylborane is linked by a sulfur atom forms a six-membered ring including a boron atom and a sulfur atom, and the condensed ring structure including the six-membered ring results in a compound with improved planarity. The bond distance of the boron-carbon bond is somewhat shorter, 1.545 to 1.580 Å (see Agou, T.; Kobayashi, J.; Kawashima, T.; Chem. Eur. j. 2007, 13, 8051).

[Chem 11]

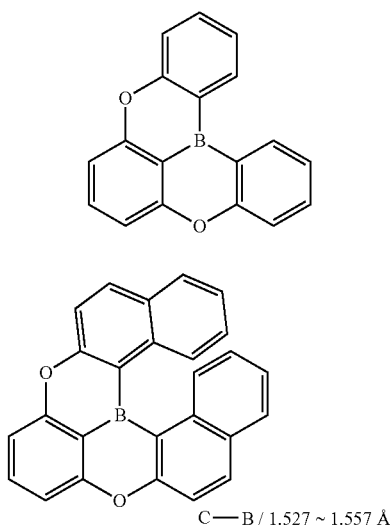

C—B / 1.527 ~ 1.557 Å

The bond distances are 1.527 to 1.557 Å in B4a and B4b, in which the 2,6-positions (both ortho positions) of the two phenyl groups in triphenylborane are linked by oxygen atoms. Due to both rigidifying effect of atomic arrangement by an oxygen bridge and electron donating effect from unpaired electron of oxygen atom to boron atom, the bond distance of the boron-carbon bond is shorter than that of triphenylborane so that the sp² property is enhanced (see H. Hirai, K. Nakajima, S. Nakatsuka, K. Shiren, J. Ni, S. Nomura, T. Ikuta, T. Hatakeyama, Angew. Chem. Int. Ed., 2015, 54, 13581).

[Chem 12]

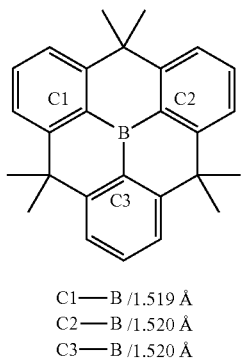

B3a

C1—B /1.519 Å
C2—B /1.520 Å
C3—B /1.520 Å

-continued

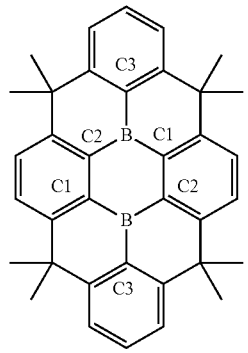

B3b

C1—B /1.520 Å
C2—B /1.532 Å
C3—B /1.532 Å

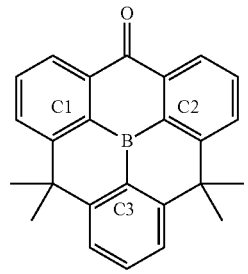

B3c

C1—B /1.518 Å
C2—B /1.528 Å
C3—B /1.506 Å

Furthermore, the bond distance is 1.506 to 1.532 Å in B3a, B3b and B3c, in which the 2,6-positions of all three phenyl groups of triphenylborane are linked by 1,1-dimethylmethylene groups. Although electrons do not flow in from oxygen atoms as in B4a and B4b, due to the completely rigid atomic arrangement, the bond distances in B3a, B3b and B3c, are the shortest and the most stabilized among the triarylboranes known so far (see Non-Patent Document 3).

[Chem 13]

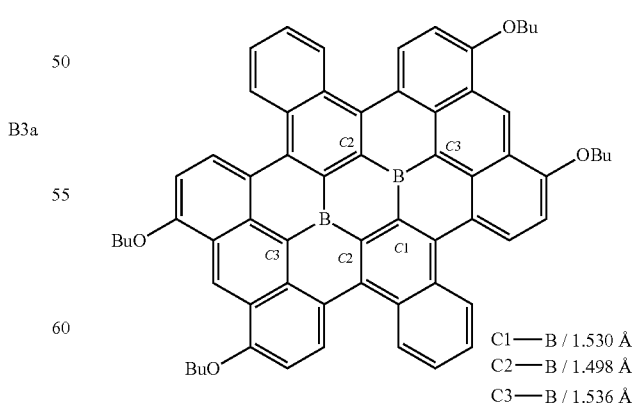

B7

C1—B / 1.530 Å
C2—B / 1.498 Å
C3—B / 1.536 Å

It was reported that the bond distances of one of the three boron-carbon bonds were 1.498 Å in B7, in which π plane expanded due to more aromatic rings condensed. This is the boron compound reported for the first time fixed on a plane and having the bond distance of 1.50 Å or less. However, the bond distances of the remaining two boron-carbon bonds are still 1.53 Å or more (see Osumi, S.; Saito, S; Dou, C. Matsuo, K.; Kume, K.; Yoshikawa, H.; Awaga, K.; Yamaguchi. S.; Chem. Sci. 2016, 7, 219).

B7 can be regarded as a compound in which a part of the carbon atoms of graphene is changed to a boron atom and is therefore considered to have rigid and strong bonds. However, since no hetero atom such as an oxygen atom exists around the boron atom, there is no electron donating effect from the lone pair of the atom to the boron atom. As a result, since boron-carbon bonds are not strong enough, all the bond distances of the boron-carbon bonds are not considered to be 1.5 Å or less.

[Chem 14]

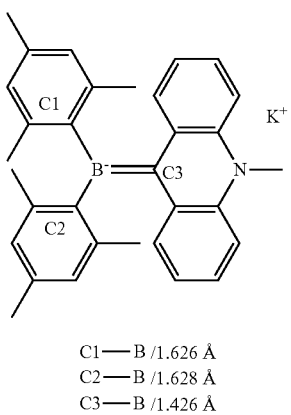

C1—B /1.626 Å
C2—B /1.628 Å
C3—B /1.426 Å

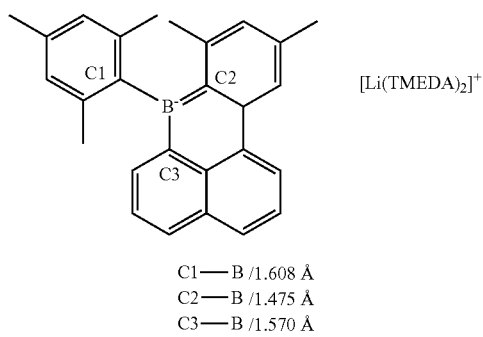

C1—B /1.608 Å
C2—B /1.475 Å
C3—B /1.570 Å

Besides them have been reported B8 (Chiu, C. W; Gabbai, F. P.; Angew. Chem. Int. Ed. 2007, 46, 6878) and B9 (see Hoefelmeyer, J. D.; Sole. S.; S. Gabbai, F. P. Dalton Trans. 2004, 1254), which are ionic compounds having a boron atom and a carbon atom at the benzyl position forming a double bond. Although the bond distance of B=C double bond of 1.48 Å or less is achieved in these compounds, the bond distance of BC single bond is considerably longer than that of the above-described compound groups, that is, 1.570 to 1.628 Å.

[Chem 15]

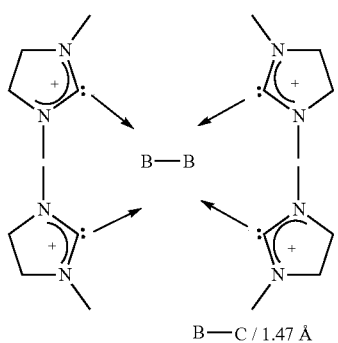

B—C / 1.47 Å

Other than triarylboranes, the bond distances of boron-carbon bonds are 1.48 Å or less in B5, in which imidazole carbenes having strong electron donating ability are coordinated. However, this molecule is thermally and electrochemically unstable due to a boron-boron bond and cannot be used for industrial purposes. Meanwhile, in the case where carbenes are coordinated, there is also a backdonation effect from boron which causes a synergistic effect with strong electron donation effect, so that the bonding distance is considered to be short. Since it is difficult to reduce the bond distances of boron-carbon bonds to 1.50 Å or less without using such strengthening means, there seems to be no report so far on it.

The distance between the B—C bonds and a torsion angle described later in the triarylborane compound according to the present invention can be calculated from the structure by structure optimization obtained by molecular orbital calculation.

Density functional theory (DFT) can be used for molecular orbital calculation to calculate the structure optimization and the electron density distribution. Software for calculating molecular orbitals can be used for calculation, in which B3LYP as a functional and 6-31G (d) as a basis function are used in a calculation method. The software is not particularly limited, and calculation can be similarly performed by using any software.

In the present invention, Gaussian 09 (Revision C. 01, M. J. Frisch, et al., Gaussian, Inc., 2010) manufactured by Gaussian GmbH USA was used as software for molecular orbital calculating.

Although some bond distances are written to three or more decimal places in the present specification, a value rounded off to two decimal places are taken as a bond distance according to the present invention.

<Planarity and Symmetry>

The triarylborane of the present invention is characterized in that the bonds between a boron atom and carbon atoms are strengthened. The physical property value thereof is best summarized to the bond distances of the boron-carbon bonds of 1.48 Å or less.

A triarylborane satisfying this condition results in a compound having a strong $sp^2$ property. Therefore, a boron atom and three carbon atoms around the boron are present on a plane in the most typical compound in the present invention, for example, in a molecule having a triple phenoxaborin structure and represented by Formula (1) in which $X_1$, $X_2$, and $X_3$ are all oxygen atoms.

By the strong $sp^2$ property, three aryl groups are basically equivalent to each other and have an axis of three-fold rotation symmetry. However, each aryl group and the group substituted therefor are not necessary the same so that there is no symmetry.

<Crystal Structure>

The following compound B3 is one of the representative compounds of the present invention. It has a simple chemical structure, but is a novel compound created by the present inventors for the first time in the world through various synthesis studies described in Comparative Examples and Examples described later.

Figure 7:
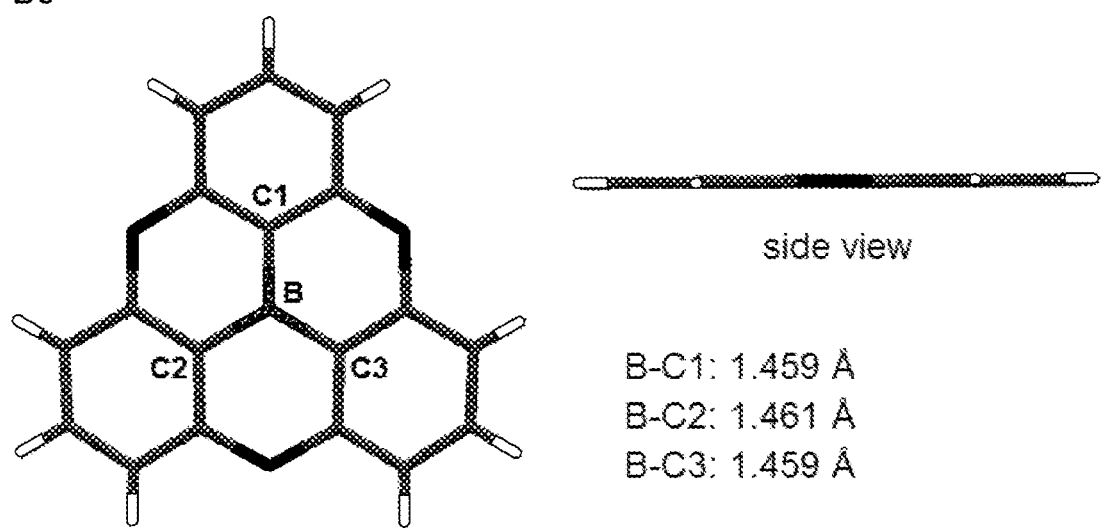

Since a single crystal from which X-ray diffraction of the compound can be measured has been obtained, the analysis result is shown in FIG. 7.

[Chem 16]

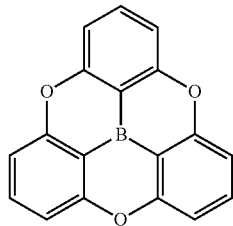

B3

By DFT calculation, it had been suggested that the molecular structure of triphenylborane (B3) having three phenyl groups bridged by three oxygen atoms had a C3 symmetry axis and was a completely planar structure. It was confirmed that the actual structure is almost the same and that the boron-carbon bond distances were 1.459 to 1.461 Å, which was the shortest in the triarylboranes known so far. In addition, it was also suggested that this short distance realizes high planarity.

In the present invention, the term "plane" means that the absolute value of a torsion angle of the boron-carbon bonds obtained by the DFT calculation is in the range of 0 to 15 degrees.

The characteristic physical properties of the triarylboranes of the present invention have been described above. The DFT calculation and the measured values by X-ray analysis have high correlation as described above. Accordingly, in defining the scope of the present invention, a stabilized structure in a ground state is calculated by DFT calculation. A compound in which the boron-carbon bond distance in the calculated structure is 1.48 Å or less is essentially the compound conforming to the same technical concept as the present invention, that is, it can be uniquely determined to be the compound of the present invention.

Furthermore, even newly synthesized compounds in the future are also to be included in this patent as long as it is a triarylborane having boron-carbon bond distances of 1.48 Å or less.

<<Expectation and Application of Triarylborane to Electronic Devices>>

The π-conjugated boron compound according to the present invention is basically an electron-deficient compound, and is essentially a compound easily causing hopping movement of electrons using the LUMO level. However, depending on a substituent and a linking group to be selected, it can be a compound having a bipolar property be used for various energy levels. Therefore, it can be used not only as a fluorescent compound, a host compound, or an assist dopant but also as a compound suitable for hole transporting and electron transporting. Accordingly, the π-conjugated boron compound according to the present invention can be used for an organic functional layer in an organic electroluminescence element such as a light emitting layer, a hole injection layer, a hole transport layer, an electron blocking layer, a hole blocking layer, an electron transport layer, an electron injection layer, and can be used for various electron transport layer devices. In addition, due to high planarity and an empty orbital orthogonal to the plane, the compound according to the present invention easily exhibits interaction with or coordination to other molecules so as to be used as a doping material causing various functions.

1. Regarding Organic EL Element

<Organic Electroluminescence Element>

An organic electroluminescence element (organic EL element) according to the present invention is an organic electroluminescence element having an organic functional layer including at least a light emitting layer between an anode and a cathode. At least one layer in the organic functional layer is a U conjugated boron compound according to the present invention. The organic EL device according to the present invention can be suitably provided for a lighting device and a display device.

Representative element constitutions used for an organic EL element of the present invention are as follows, however, the present invention is not limited to these.

(1) Anode/light emitting layer/cathode
(2) Anode/light emitting layer/electron transport layer/cathode
(3) Anode/hole transport layer/light emitting layer/cathode
(4) Anode/hole transport layer/light emitting layer/electron transport layer/cathode
(5) Anode/hole transport layer/light emitting layer/electron transport layer/electron injection layer/cathode
(6) Anode/hole injection layer/hole transport layer/light emitting layer/electron transport layer/cathode
(7) Anode/hole injection layer/hole transport layer/(electron blocking layer/) light emitting layer/(hole blocking layer/) electron transport layer/electron injection layer/cathode Among these, the embodiment (7) is preferably used. However, the present invention is not limited to this.

The light emitting layer of the present invention is composed of one layer or a plurality of layers. When a plurality of layers is employed, it may be placed a non-light emitting intermediate layer between the light emitting layers.

According to necessity, a hole blocking layer (it is also called as a hole barrier layer) or an electron injection layer (it is also called as a cathode buffer layer) may be provided between the light emitting layer and the cathode. Further, an electron blocking layer (it is also called as an electron barrier layer) or a hole injection layer (it is also called as an anode buffer layer) may be provided between the light emitting layer and the anode.

An electron transport layer used in the present invention is a layer having a function of transporting electrons. The electron transport layer includes an electron injection layer and a hole blocking layer in a broad sense. Further, the electron transport layer unit may be composed of plural layers.

A hole transport layer used in the present invention is a layer having a function of transporting holes. A hole transport layer includes a hole injection layer and an electron blocking layer in a broad sense. Further, a hole transport layer unit may be composed of plural layers.

In the representative element constitutions as described above, the organic functional layer refer to layers other than an anode and a cathode.

FIG. 1 is an example of a configuration of the organic EL element, and is a schematic diagram corresponding to the configuration of (4) described above. In FIG. 1, the hole transport layer 5, the light emitting layer 6, and the electron transport layer 7 are the organic functional layer F.

Figure 2:
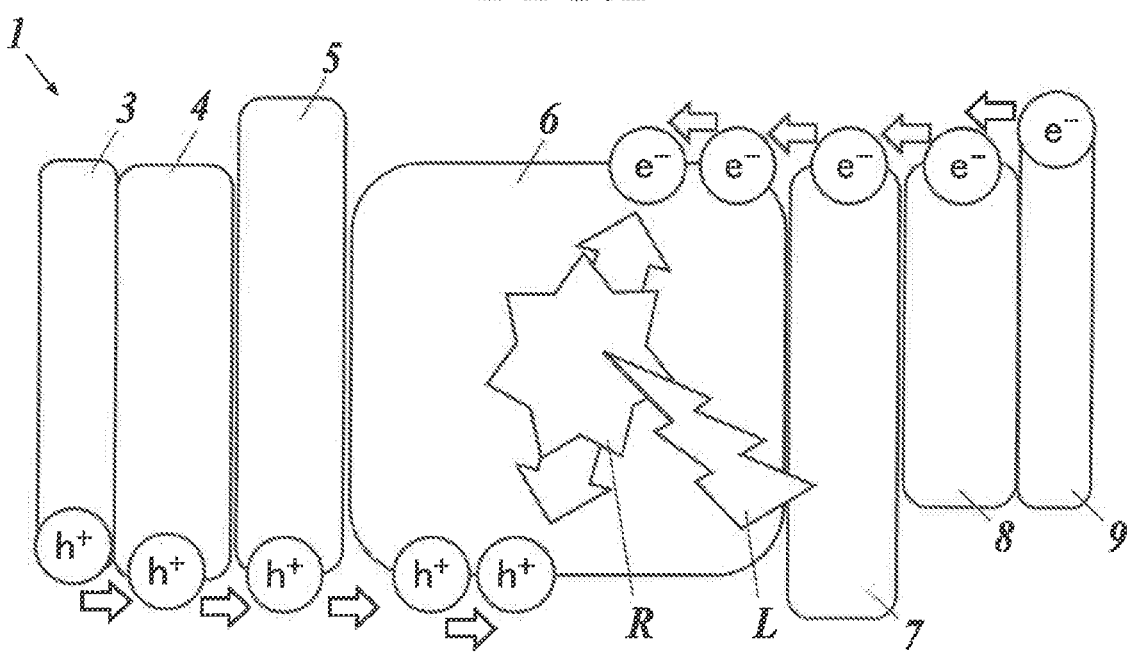
FIG. 2 A schematic view showing a charge flow and mechanism of emission in an organic EL element FIG. 3 An example of a sectional view showing a solar cell composed of an organic photoelectric conversion element of a bulk heterojunction type FIG. 4 A diagram showing an exemplary configuration of an organic thin film transistor FIG. 5 An example of a transparent electrode having a silver layer on a substrate via an intermediate layer FIG. 6 A structure of triphenylborane B3a according to X-ray crystal structure analysis FIG. 7 An X-ray diffraction analysis result of compound B3

FIG. 2 is a schematic diagram showing mechanism of charge flow and light emission in the organic EL device. When voltage is applied to the organic EL element 1, electrons (e⁻) are injected from the cathode 9 into the electron injection layer 8 and holes (h⁺) are injected from the anode 3 into the hole injection layer 4.

Subsequently, electrons and holes are respectively transported to the electron transport layer 7 and the hole transport layer 5, which are adjacent organic layers on a side opposite to the electrode.

Finally, recombination R of the electrons and holes encountered in the light emitting layer 6 generate excitons. An organic EL element is a light emitting element using light (fluorescence or phosphorescence) L emitted when the excited state returns to a ground state. In FIG. 2, the organic functional layer F refers to layers from the hole injection layer 4 to the electron injection layer 8.

<Electron Transport Material>

In order to flow electrons into the organic compound, the first step is to inject charge from the electrode into the organic functional layer. Two types of injection mechanism are known: Schottky thermal radiation and tunnel injection. The charge injected into the organic functional layer causes hopping conduction so that current flows, by using an external electric field applied between the two electrodes as a driving force. The current in this case is space charge limited current (SCLC) not according to the Ohm's law but according to the child rule and is inversely proportional to the cube of the film thickness as shown in the following equation. Therefore, the thickness of the organic functional layer has to be extremely thin.

$$(\text{Amount of space charge limited current}) \propto (\text{voltage})^2/(\text{thickness})^3$$

In an actual electronic display or lighting device, it is necessary to flow a large current of several tens of $A/m^2$ by a voltage of several V. Therefore, the thickness per layer has to be approximately 50 nm or less.

Here, the flow of electrons in the organic functional layer is based on injecting electrons into the LUMO level of the compound and transferring them to the next molecule. Therefore, it is important that portions of LUMO are in close proximity between an electron transporting compound (hereinafter also referred to as an electron transporting material) itself and adjacent molecules thereof. It is not too much to say that the flow of electrons changes with this overlapping.

That is, the portion for accepting electrons is preferably flat and free from steric hindrance. In a triarylborane, the LUMO position is almost always at a boron atom due to the strong electron accepting property of the boron atom, and three bonds from the boron atom forms $sp^2$ orbital, a planar structure with bond angle of 120°. Therefore, regarding the hopping movement of electrons, a triarylborane has the most excellent properties among all organic compounds.

This can be easily anticipated and is supported by the fact that there are numerous research examples for electron transport materials for organic EL. However, in the case of a triarylborane, although the packing of compounds and the accompanying electronic hopping are good, the boron atom itself is easily attacked by a nucleophilic species or a Lewis base as shown in [Chem 1]. As a result, $sp^2$ collapses and becomes a pyramid structure of sp3, so that there is also a problem of electron mobility remarkably deteriorated with passage of current.

Meanwhile, the triple phenoxaborin compound, which is the basic and representative compound of the present invention, has short bond distances of 1.48 Å or less between a boron atom and carbon atoms in the triarylborane due to both steric effect of the three oxygen bridges and electron donation effect from the oxygen atoms. This fortunately makes the planar structure shown in FIG. 7 stronger than the boron compound known so far, so that the attack by nucleophiles and Lewis bases can be overcome. The strengthened compound can destroy the nucleophilic species and attack by the Lewis base. Therefore, it can be said that it is an electron transporting material with very good properties, while high electron hopping property of the conventional triarylborane is maintained and reduction of the electron current amount with passage of current is effectively suppressed.

<Light Emitting Material>

As described in the previous section, the triarylborane corresponding to the present invention is a compound capable of maintaining high $sp^2$ property. Therefore, no matter what aryl group is bonded to the boron atom and whether the three substituents are the same or different, LUMO is basically located on the boron atom at the aryl moiety substituted by LUMO. Therefore, any molecule is an intramolecular CT type dye, though the strengths are different, and the strong $sp^2$ property makes the oscillator strength is also strong. Almost all molecules thereby emit fluorescence (though light emission is stopped by accelerating intersystem crossing to triplets by substituting heavy atoms such as bromine and iodine).

Further, as explained in the previous section, the triarylborane in an organic EL device makes current always flow due to the hopping movement of electrons on the boron atom and can be a light emitting material due to the fluorescent property.

Further, because bipolar substances can be easily formed by changing three aryl groups to substituents having hole transporting property, the compound group also facilitates molecular design as a light emitting material for organic EL.

In fact, the following non-patent documents etc. introduce research examples of a triarylborane applied to a light-emitting material of an organic EL.

http://onlinelibrary.wiley.com/doi/10.1002/adfm.200290007/full

J. Mater. Chem. C, 2015, 3, 9122-9130.

Chem. Comm., 51, 9443, 2015.

Angew Chem Int Ed Engl 2015 Nov 13. Epub 2015 Nov. 13.

Furthermore, in the following non-patent documents, thermally activated delayed fluorescence (TADF) can be successfully obtained by treating a triarylborane as a LUMO localizing portion and by further introducing an electron donating group such as carbazole and diphenylamino group into the molecule. In actual organic EL devices according to any of the documents, extremely high luminous efficiency, an external extraction quantum efficiency of 15% or more (5% in usual fluorescence emission being the theoretical limit), is obtained. However, none the research examples disclose light emission lifetime. Due to the inherent weakness of molecules unique to conventional triarylboranes, practical use as an industrial product is considered to be impossible, even though it can be applied for researches.

J. Mater. hem. C, 2015, 3, 9122-9130.

Chem. Comm., 51, 9443, 2015.

Angew Chem Int Ed Engl 2015 Nov 13. Epub 2015 Nov. 13.

<Light-Emitting Supplementary Material (Host Compound)>

Preferably, the host compound used for the light emitting layer as the dopant diluent and energy transfer agent is a bipolar type basically capable of both electron conduction and hole conduction. In this respect, it is also possible to use a bipolar compound or a TADF compound designed for the light emitting material as the host compound. However, because one of the functions of host compound is to maintain uniform electric field intensity, local microcrystallization thereof is not acceptable. Even if not crystallized, compounds stabilized in an aggregated state (low $T_1$) or forming excimers or exciplexes upon electric field excitation cannot be used as host compounds.

Since many causes result from intense stacking phenomenon of molecules in such cases, molecules can be suitably utilized as a host compound by introducing sterically hindered substituents at arbitrary positions so that the causes are mitigated.

<Semiconductor Material>

While thin films or structures made of organic compounds are basically insulators, among the π-conjugated compounds are also known many compounds which exhibit semiconductor properties, due to close distance between molecules which facilitates hopping movement of carriers. Typical examples include pentacene and polythiophene. Some triarylboranes also exhibit semiconductor properties by electron conduction using an empty P orbital of a boron atom, but in many cases, in order to be resistant to the attack by nucleophiles and Lewis bases on boron atoms, the triarylborane has a substituent in the aryl group to sterically shield the boron atom, for example, a sterically bulky substituent at the ortho position of the aryl group bonded to the boron atom as in trimethylborane or tris-2-biphenylborane. Since the distance between the boron atom and the boron atom in which LUMO is localized is long in such chemical structures, mobility is insufficient for use as an n-type material of a transistor or a heterojunction type organic solar cell, that is, not sufficiently effective.

However, in a compound representative of the compound group of the present invention, that is, in a compound having a triple phenoxaborin skeleton in which three phenyl groups of triphenylborane are linked by oxygen atoms at all ortho positions to form a disk-like molecule, the $sp^2$ property is so strong (that is, the planarity is so rigid) that it is not necessary to shield the boron atom with sterically hindered substituents. Therefore, a thin film or a structure formed with this compound, in which the distance between the boron atoms where LUMO is present is short, exhibits n-type semiconductivity and can be suitably used as a semiconductor material. This is the first finding of organic boron compounds which have been stably present in the atmosphere so far and is an industrially applicable significant finding.

<<Specific Compound of the Present Invention>>

The π-conjugated boron of the present invention is a π-conjugated boron compound in which the compound boron atom is bonded to three aromatic groups via three boron-carbon bonds, and bond distances of the three boron-carbon bonds are all 1.48 Å or less.

Examples of the aromatic groups include aromatic hydrocarbon ring groups (aryl groups) and an aromatic heterocyclic group.

Examples of the aromatic hydrocarbon ring group include a phenyl group, a p-chlorophenyl group, a mesityl group, a tolyl group, a xylyl group, a naphthyl group, an anthryl group, an azulenyl group, an acenaphthenyl group, a fluorenyl group, a phenanthryl group, an indenyl group, a pyrenyl group, a biphenylyl group, and the like.

Examples of the aromatic heterocyclic group include a pyridyl group, a pyrimidinyl group, a furyl group, a pyrrolyl group, an imidazolyl group, a benzimidazolyl group, a pyrazolyl group, a pyrazinyl group, a triazolyl group (for example, 1,2,4-triazole-1-yl group, 1,2,3-triazole-1-yl group, etc.), an oxazolyl group, a benzoxazolyl group, a thiazolyl group, an isoxazolyl group, an isothiazolyl group, a furazanyl group, a thienyl group, a quinolyl group, a benzofuryl group, a dibenzofuryl group, A thienyl group, a dibenzothienyl group, an indolyl group, a carbazolyl group, a carbolinyl group, a diazacarbazolyl group (one of the carbon atoms constituting the carboline ring of the carbolinyl group is replaced with a nitrogen atom), a quinoxalinyl group, a pyridazinyl group, a triazinyl group, a quinazolin group, a phthalazinyl group, and the like. These aromatic groups may have a substituent.

The aromatic group is preferably an aromatic hydrocarbon ring group (an aryl group). More preferably, the π-conjugated boron compound is a triarylborane in which a boron atom is bonded to three aryl groups and the three aryl groups are present on a same plane.

Further, it is preferable that triarylborane has a disk-like structure in which hetero atoms link adjacent positions of carbon atoms which are in the three aryl groups and bonded to the boron atom.

Any hetero atom may be used as long as it has an electron donating effect from a lone pair of the hetero atom to the boron atom and allows all bond distances of the three boron-carbon bonds to be 1.48 Å or less, preferably an oxygen atom or a nitrogen atom.

Such compound is preferably a triarylborane having a structure represented by the following Formula (1).

[Chem 18]

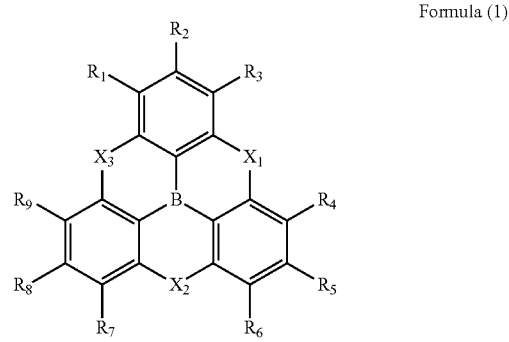

Formula (1)

(in Formula (1), $R_1$ to $R_9$ each independently represent a hydrogen atom, a chain alkyl group, a ring alkyl group, an alkoxy group, an aryloxy group, an ester group, a cyano group, an alkylamino group, an arylamino group, an aromatic hydrocarbon ring group, or an aromatic heterocyclic group; $X_1$ to $X_3$ each independently represent $NR_{10}$ or an oxygen atom and at least one of $X_1$ to $X_3$ represent an oxygen atom; and $R_{10}$ represents a hydrogen atom, a chain alkyl group, a ring alkyl group, an aromatic hydrocarbon ring group, or an aromatic heterocyclic group.).

The chain alkyl group may be linear or branched. Examples of the linear alkyl group include a methyl group, an ethyl group, a propyl group, a butyl group, a pentyl group, a hexyl group, and the like. Examples of the branched alkyl group include an isopropyl group, an isobutyl group, a sec-butyl group, a tert-butyl group, a cyclopropylmethyl group, a cyclopropylethyl group, a cyclobutylmethyl group, a cyclobutylethyl group, a cyclopentylmethyl group, a cyclopentylethyl group, a cyclohexylmethyl group, a cyclohexylethyl group, and the like.

Examples of the cyclic alkyl group include a cyclopropyl group, a cyclobutyl group, a cyclopentyl group, a cyclohexyl group, a cycloheptyl group and the like.

Examples of the aromatic hydrocarbon ring group include a phenyl group, a p-chlorophenyl group, a mesityl group, a tolyl group, a xylyl group, a naphthyl group, an anthryl group, an azulenyl group, an acenaphthenyl group, a fluorenyl group, a phenanthryl group, an indenyl group, a pyrenyl group, a biphenylyl group and the like Examples of the aromatic heterocyclic group include a pyridyl group, a pyrimidinyl group, a furyl group, a pyrrolyl group, an imidazolyl group, a benzimidazolyl group, a pyrazolyl group, a pyrazinyl group, a triazolyl group (for example, 1,2,4-triazolyl-1-yl group, 1,2,3-triazolyl-1-yl group etc.), an oxazolyl group, a benzoxazolyl group, a thiazolyl group, an isoxazolyl group, an isothiazolyl group, a furazanyl group, a thienyl group, a quinolyl group, a benzofuryl group, a dibenzofuryl group, a benzothienyl group, a dibenzothienyl group, an indolyl group, a carbazolyl group, a carbolinyl group, a diazacarbazolyl group (one of the carbon atoms constituting the carboline ring of the carbolinyl group is replaced by a nitrogen atom), a quinoxalinyl group, a pyridazinyl group, a triazinyl group, a quinazolinyl group, a phthalazinyl group, and the like.

These substituents may further have substituent(s) at arbitrary position(s). For example, an aromatic group such as a phenyl group, a pyridyl group, a pyrrole group, a thienyl group, a furyl group, an imidazolyl group, a pyrimidyl group, a pyrazyl group, a pyridazyl group and a triazinyl groups; condensed aromatic groups in which the aromatic groups are further condensed (for example, a naphthyl group, a quinolyl group, an imidazolyl group, an indoloimidazolyl group, an imidazoimidazolyl group, a dibenzothienyl group, a dibenzofuryl group, an azadibenzofuryl group, a benzimidazolyl group, a quinazolyl group, a benzopyrazinyl group, etc.); an aliphatic group such as alkyl, branched alkyl, cycloalkyl, alkenyl, alkynyl, and the like; a substituent such as a cyano group, an alkoxy group, an aryloxy group, an alkylthio group, an arylthio group, an amino group, a carbonyl group, an acyl group, an ester group, a ureido group, a urethane group, and the like; a halogen atom such as a fluorine atom, a chlorine atom, and the like.

Among them, the aromatic group (including the condensate), the aliphatic group, the cyano group, the alkoxy group, and the fluorine atom are most preferably used.

Representative examples and the bond distances of the compound according to the present invention the boron-carbon bonds thereof are shown below. Further, as a "border" compound which is to be excluded from the present invention, a compound S1 in which three aryl groups of triarylborane are linked via three nitrogen atoms is shown as a reference example.

In order to clarify the positions of the three carbon atoms bonded to the boron atom, symbols C1 to C3 are attached for convenience.

[Chem 19]

| Exemplary compound No. | Structure | B-C bond distance (Å) | | | Remarks |
|---|---|---|---|---|---|
| | | B-C1 | B-C2 | B-C3 | |
| 1 (B3) | | 1.47 | 1.47 | 1.47 | Present invention |
| 34 | | 1.48 | 1.48 | 1.48 | Present invention |

[Chem 19]
| Exemplary compound No. | Structure | B-C bond distance (Å) B-C1 | B-C2 | B-C3 | Remarks |
|---|---|---|---|---|---|
| 45 | | 1.48 | 1.48 | 1.48 | Present invention |
| S1 | | 1.49 | 1.49 | 1.49 | Reference example |
The compounds according to the present invention are exemplified below, but the present invention is not limited thereto.
[Chem 20]
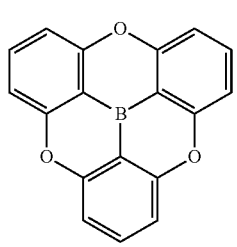
1
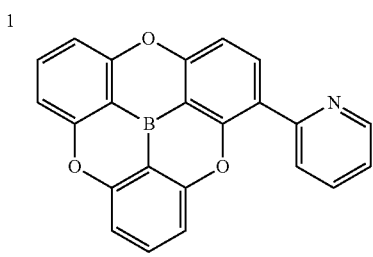
2

-continued
3
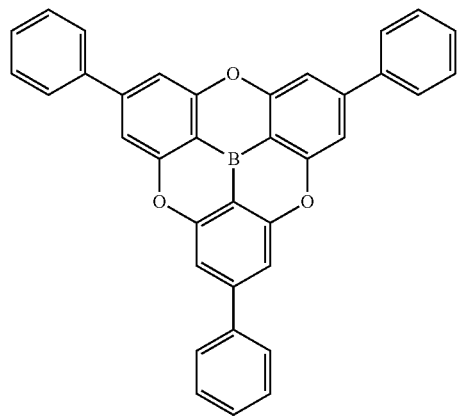
4
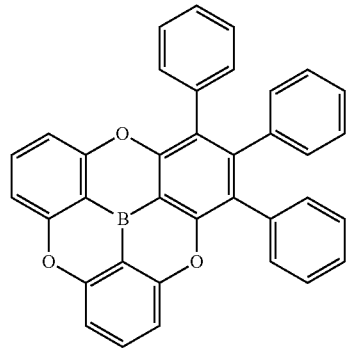
5
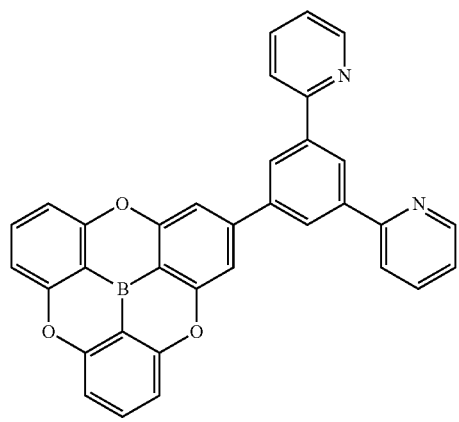
6
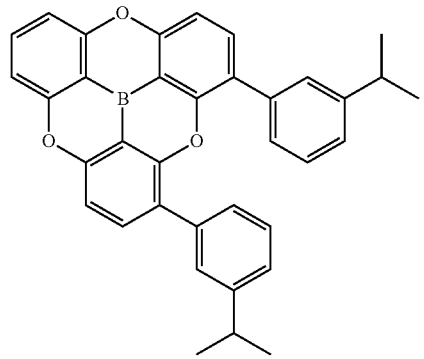
7
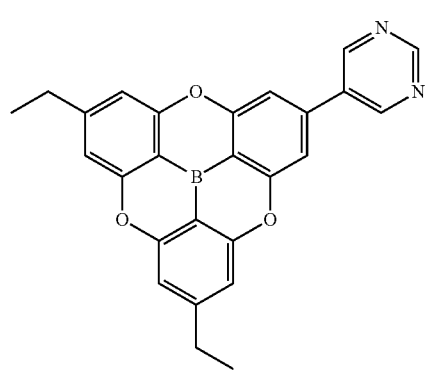
8
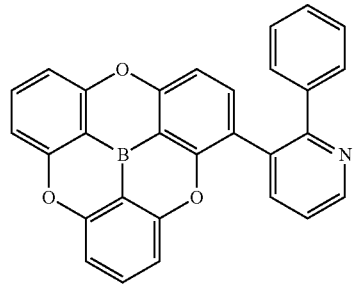
9
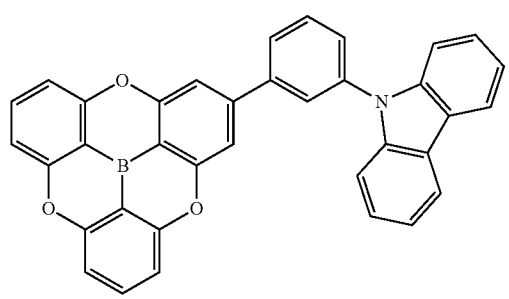

[Chem 21]
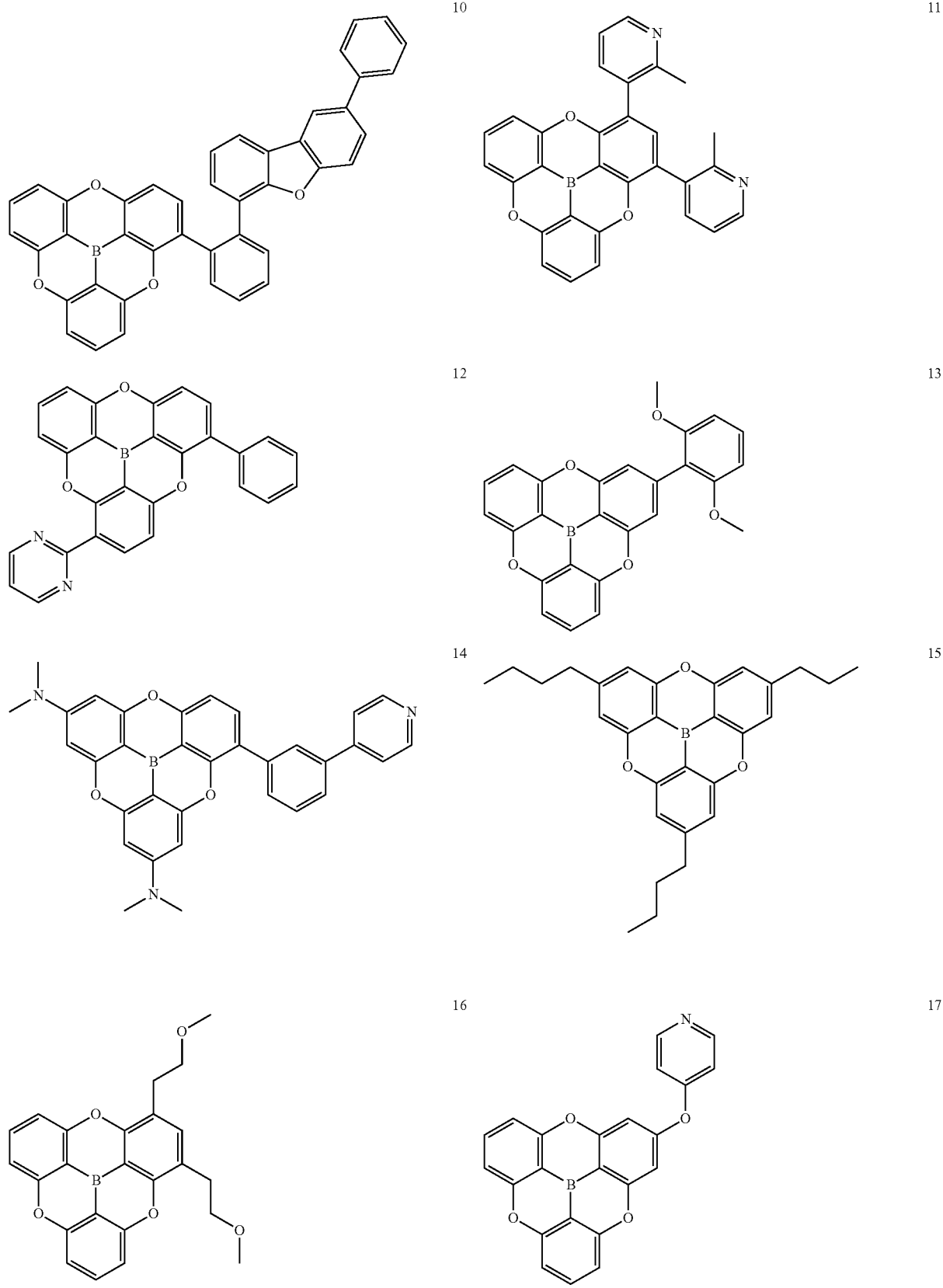

-continued
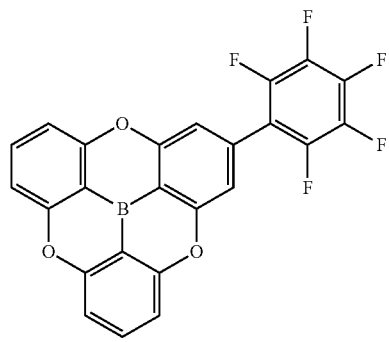
18
[Chem 22]
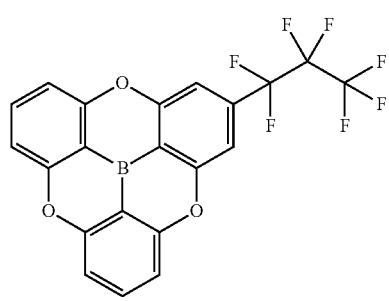
19
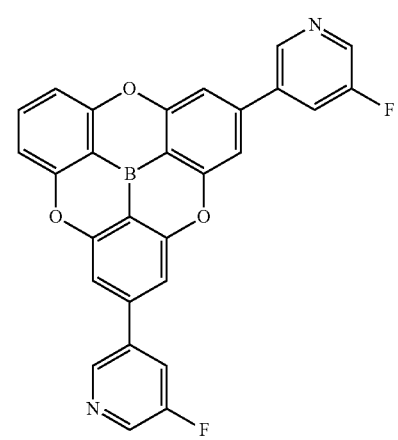
20
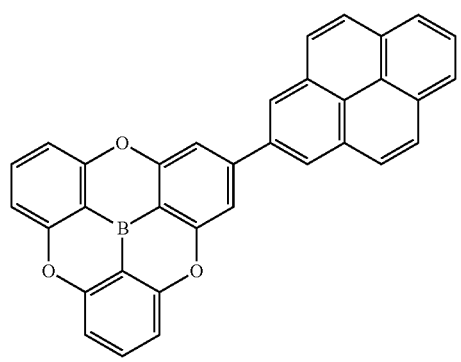
21
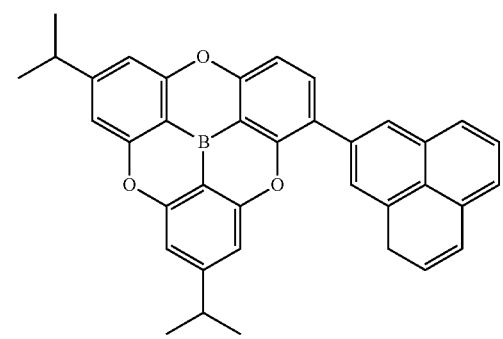
22
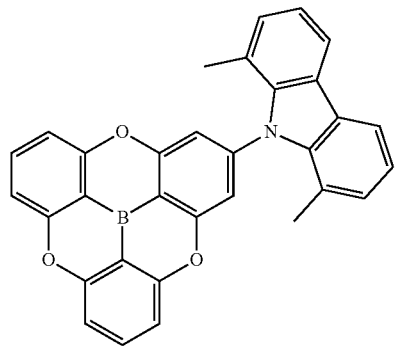
23
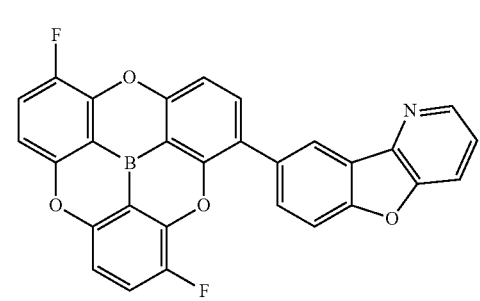
24

-continued
25
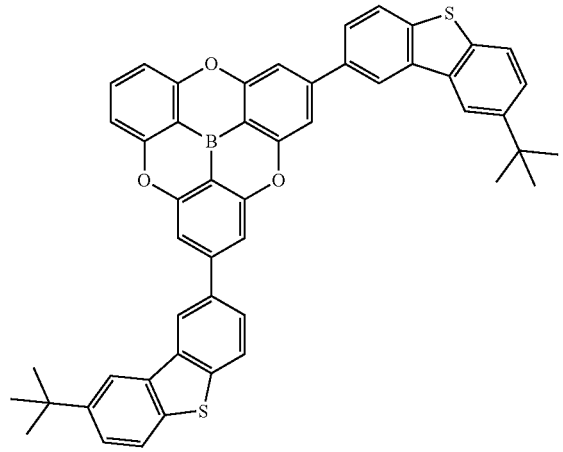
26
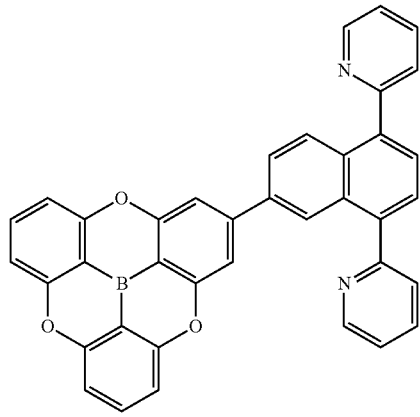
[Chem 23]
27
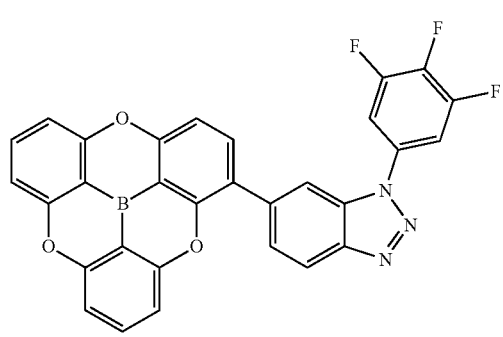
28
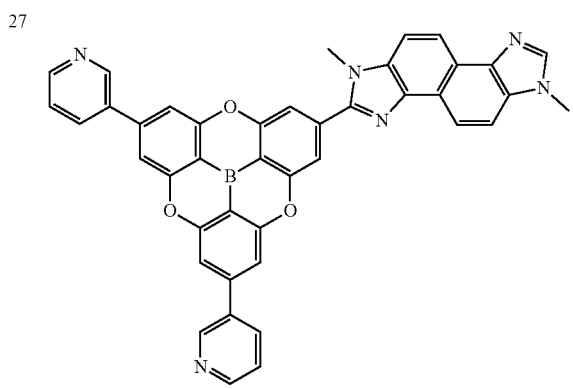
29
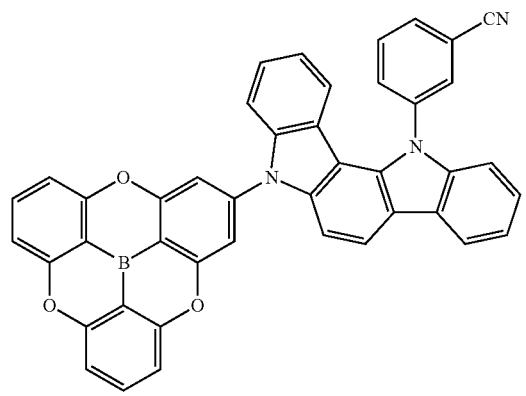
30
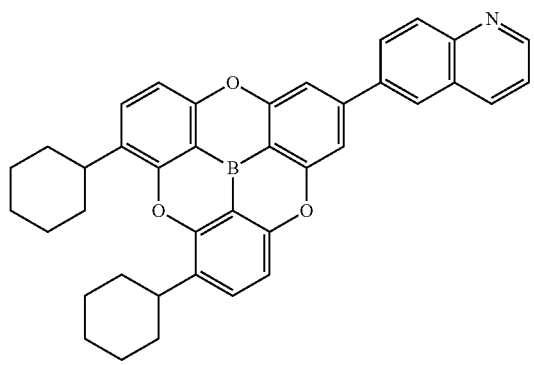

-continued
31
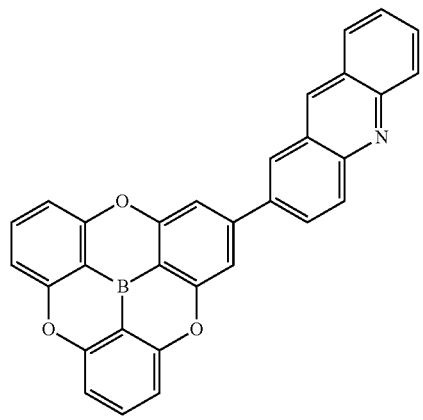
32
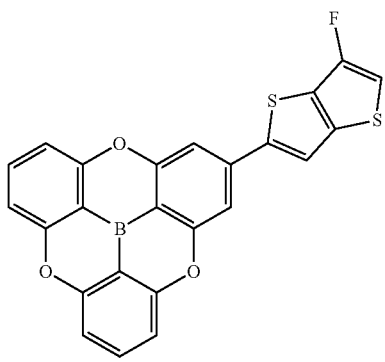
33
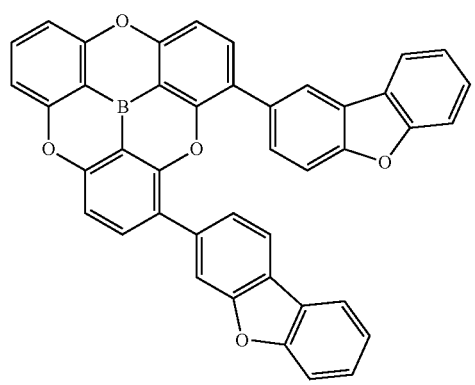
[Chem 24]
34
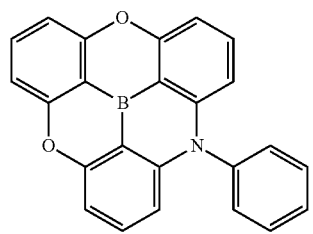
35
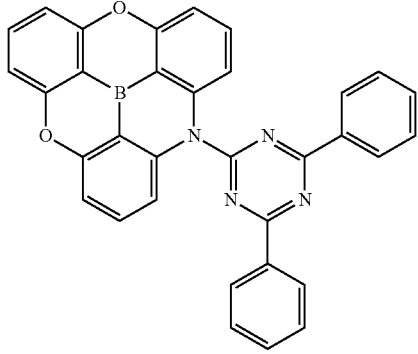
36
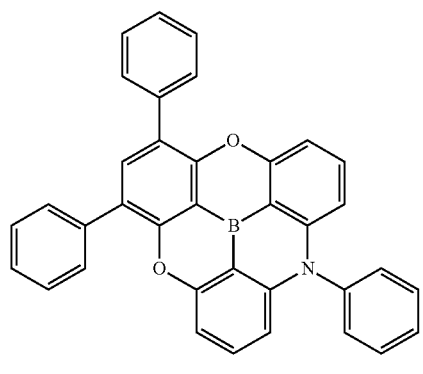
37
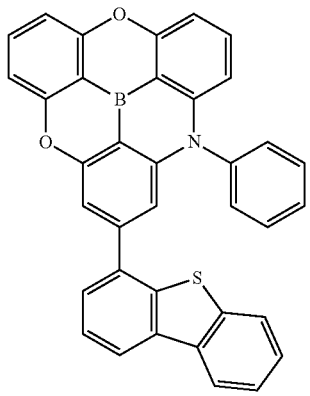

-continued
38
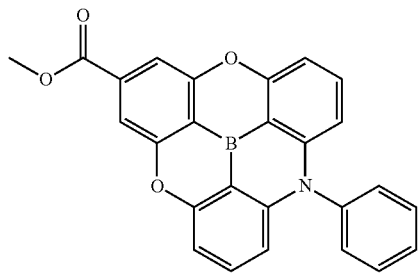
39
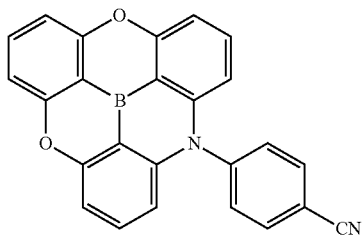
40
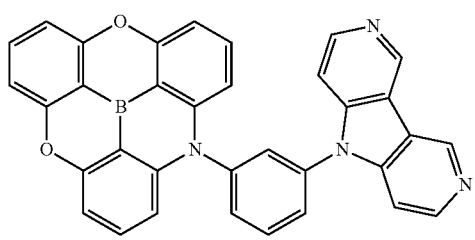
41
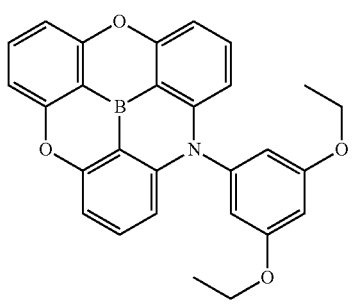
[Chem 25]
42
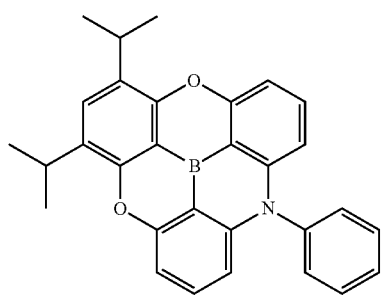
43
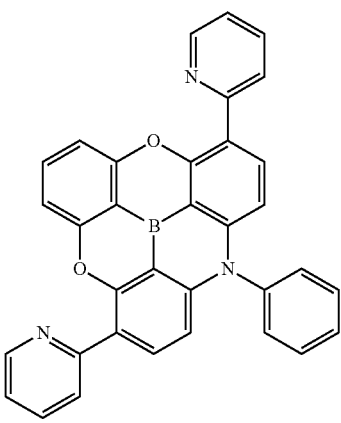
44
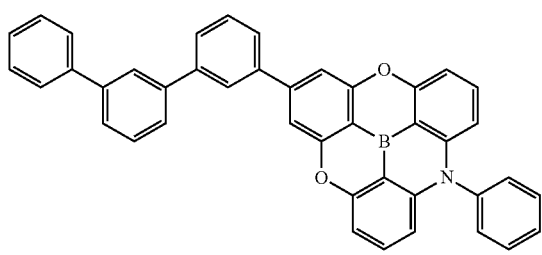
45
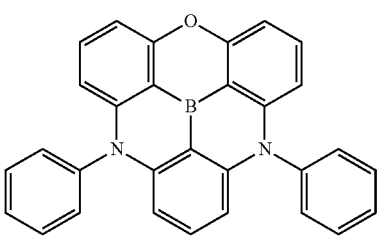
46
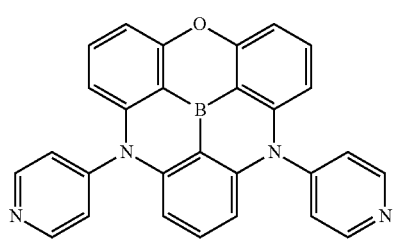
47
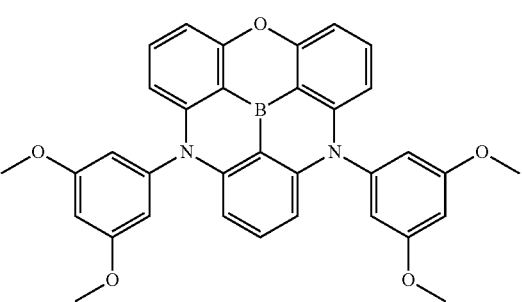

-continued
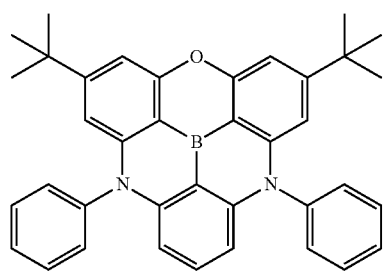
48
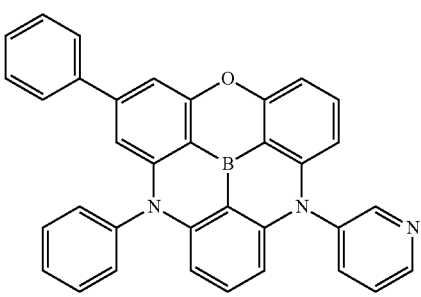
49
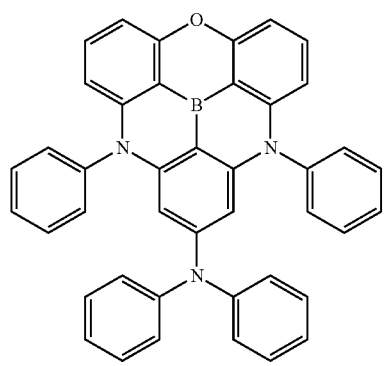
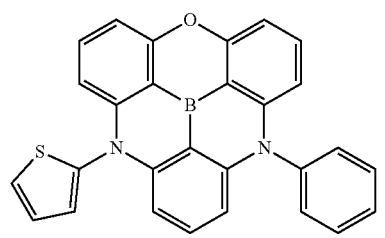
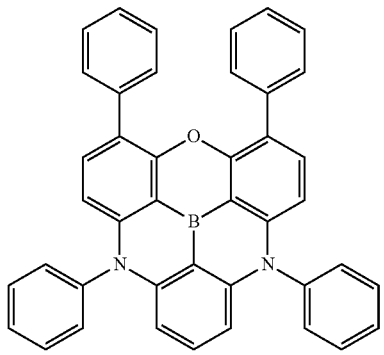
52
[Chem 26]
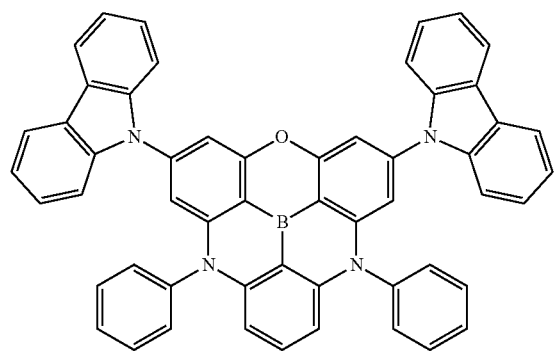

54
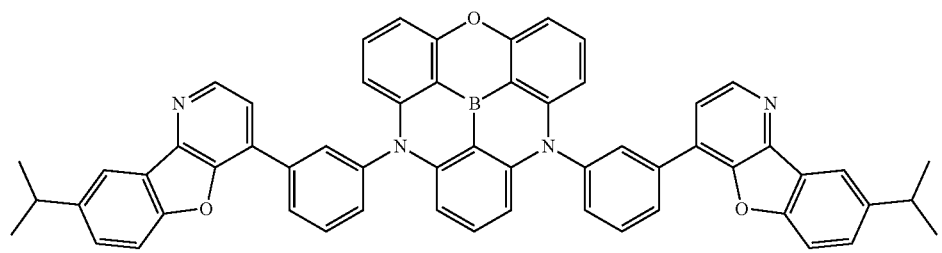
55
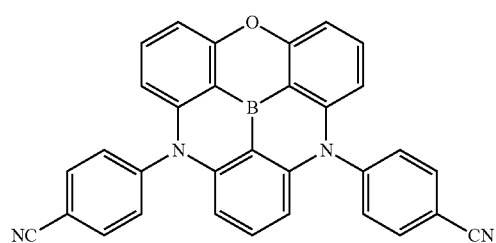
[Chem 27]
56
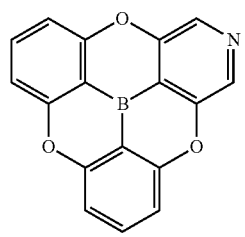
57
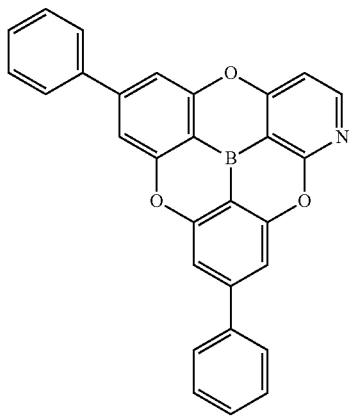
58
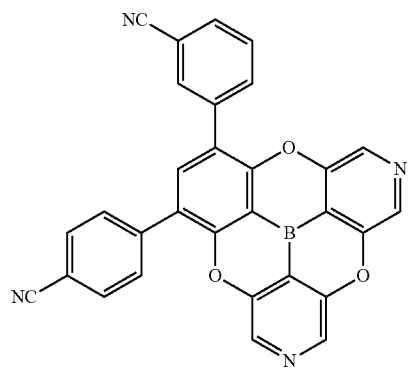
59
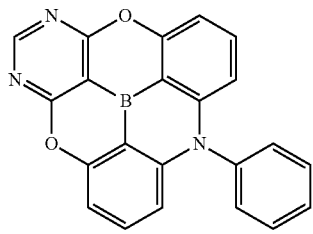

41
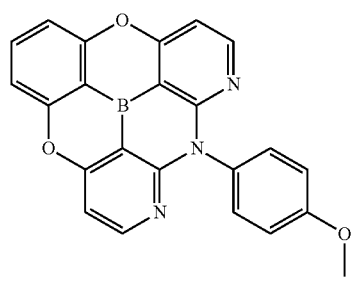
60
42
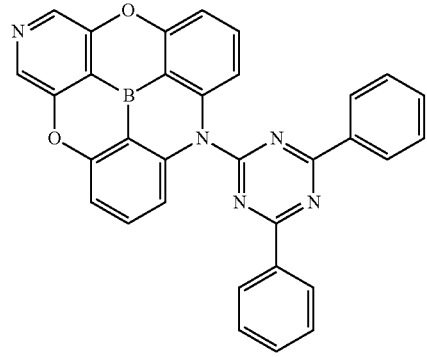
61
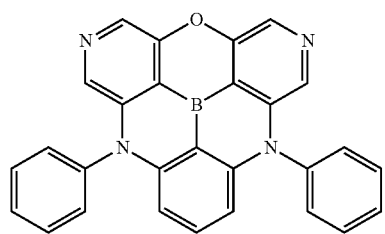
62
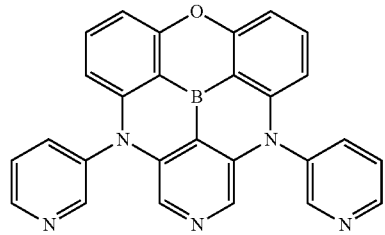
63
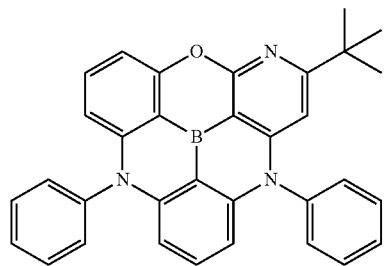
64
[Chem 28]
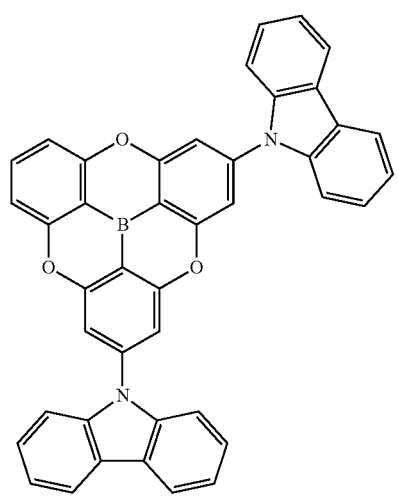
65
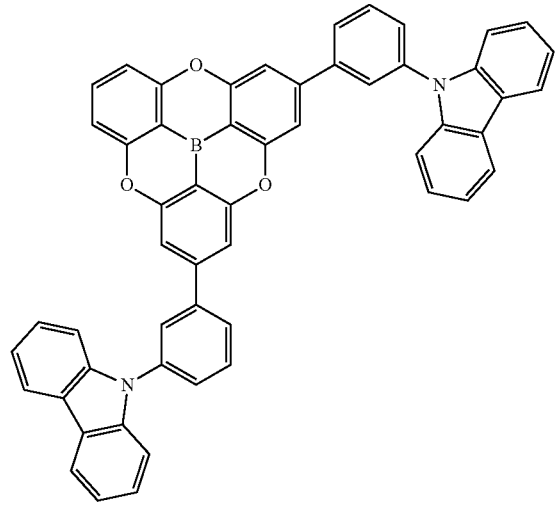
66

-continued
67
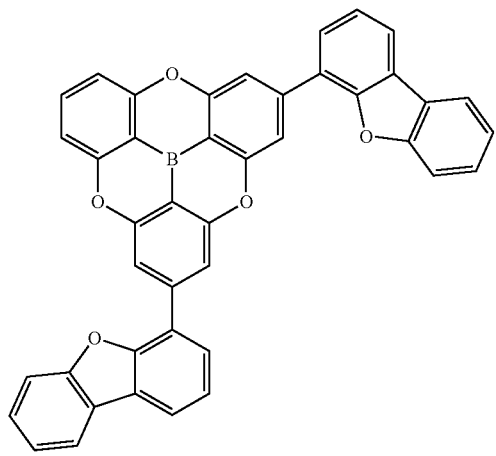
68
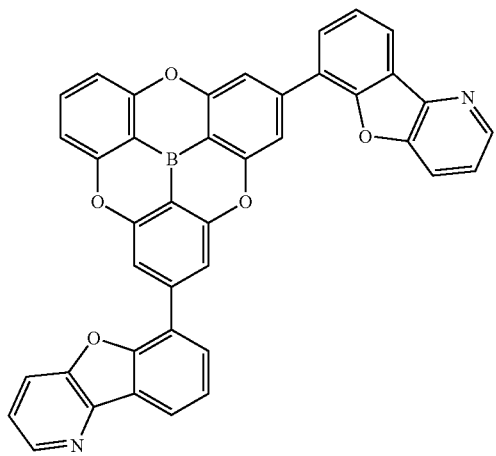
69
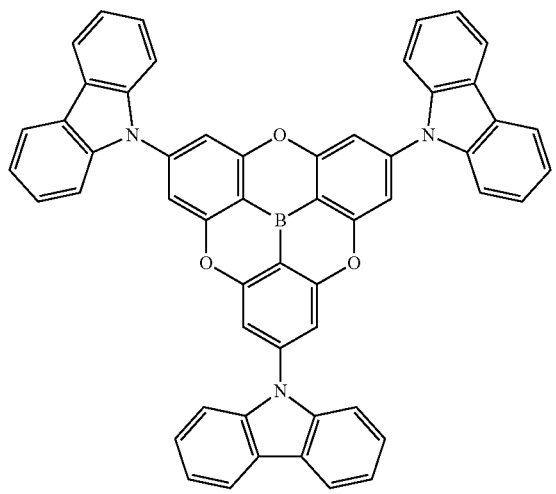
[Chem 29]
70
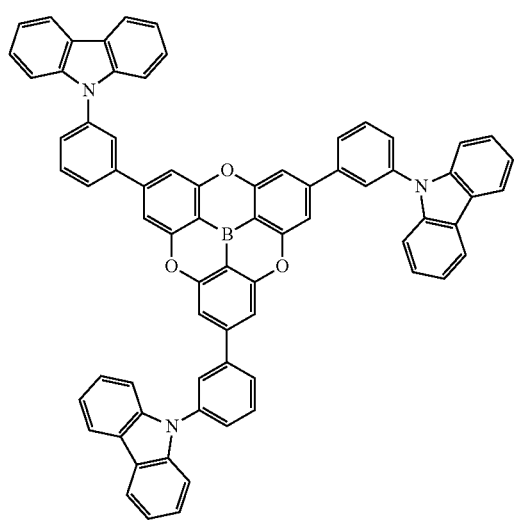
71
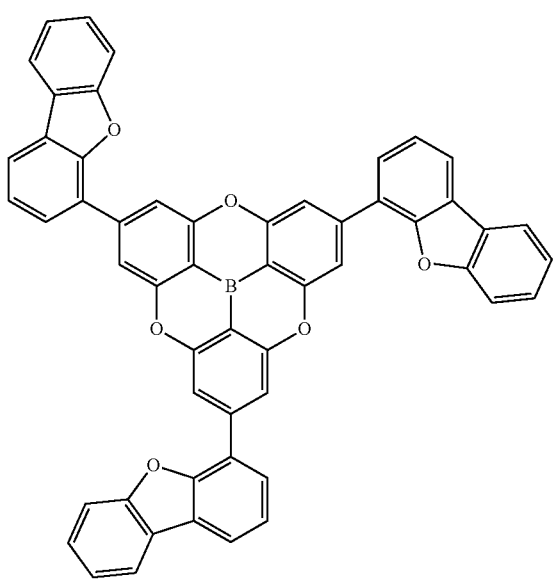

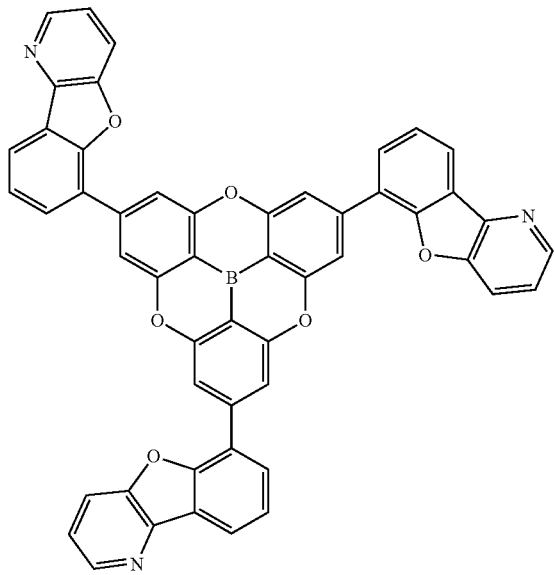

<<Synthesis of Compound of the Present Invention>>

In a method for producing a triarylborane, a triarylborane having a structure represented by the following Formula (3) is preferably produced using a triarylborane intermediate having a structure represented by the following Formula (2).

[Chem 30]

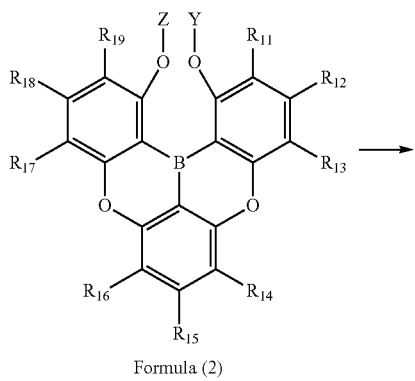

Formula (2)

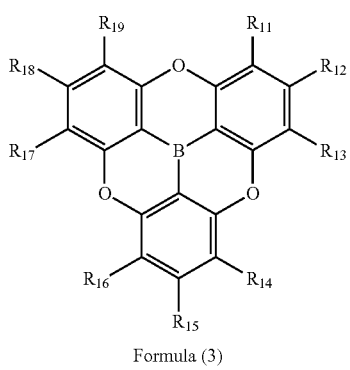

Formula (3)

(in Formula (2) and Formula (3), Y and Z each independently represent a protecting group which is a hydrogen atom, a methyl group, or a hydroxy group; and $R_{11}$ to $R_{19}$ each independently represent a hydrogen atom, a chain alkyl group, a ring alkyl group, an aromatic hydrocarbon ring group, or an aromatic heterocyclic group.).

$R_{11}$ to $R_{19}$ are synonymous with $R_1$ to $R_9$ described in Formula (1).

As the protecting group for the hydroxy group represented by Y and Z, sulfonyl groups can be preferably used. Among these, a trifluoromethanesulfonate group is preferred. Y is preferably a hydrogen atom, and Z is preferably a trifluoromethanesulfonate group.

In this production method, first, a compound (Formula (2)) having a structure in which the phenoxaborin skeleton is doubled is prepared, and the compound of the present invention represented by the Formula (3) is obtained using an intramolecular cyclization reaction to bridge the ring opening portion of the compound is with an oxygen atom.

In the intramolecular cyclization reaction, it is preferable to utilize a nucleophilic substitution reaction from the viewpoint of high yield and ease of synthesis. In this case, it is necessary that one of the two oxygen atom-containing substituents is a hydroxy group and the other is a protecting group for the hydroxy group.

Further, the triarylborane intermediate represented by following Formula (5) is preferably produced using a compound having a structure represented by following Formula (4).

[Chem 31]

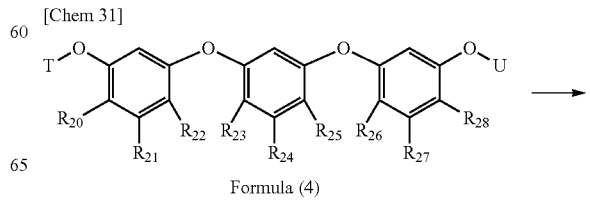

Formula (4)

-continued

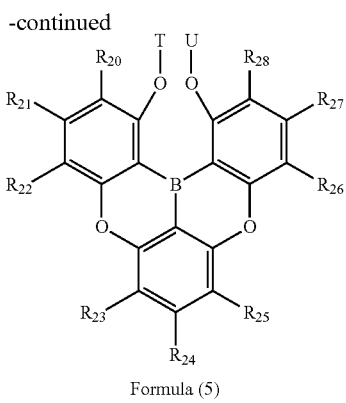

Formula (5)

(in Formula (4) and Formula (5), T and U each independently represent a protecting group which is a hydrogen atom, a methyl group, or a hydroxy group; and $R_{20}$ to $R_{28}$ each independently represent a hydrogen atom, a chain alkyl group, a ring alkyl group, an aromatic hydrocarbon ring group, or an aromatic heterocyclic group.).

$R_{20}$ to $R_{28}$ are synonymous with $R_1$ to $R_9$ described in Formula (1).

As the protecting group for the hydroxy group represented by T and U, methyl groups or sulfonyl groups can be preferably used. In particular, both T and U preferably represent a methyl group.

In this production method, an ether compound (Formula (4)) in which three aryl groups are bridged with oxygen atoms is prepared, this compound is reacted with a reagent including boron to form three carbon-boron bonds, and a compound (Formula (5)) having a doubled phenoxaborin skeleton structure is obtained.

It is preferable that both of the substituents of the terminal oxygen atom in the Formula (4) are substituents capable of realizing high yield without adverse effects on the reaction.

<<Industrially Applicable Field>>
<Organic EL Element>

As described above, the present invention can be applied not only to the electron injection material, the electron transport material, and a light emission aid (host compound) in which both electrons and holes has to move in the organic EL element, but also to a hole block material using the deep LUMO level.

Further, a HOMO-LUMO separation type charge transfer complex type phosphor having a periphery of a boron atom as a LUMO localization portion and a thermally activated delayed fluorescence (TADF) substance as a developed system thereof, can be used as a light emitting substance (it is also called as a dopant or an emitter) in the light emitting layer. It is also possible to use them as light emission assistants by adding other dopants. Further, it can be used simply as a host compound such as a fluorescent dopant or a phosphorescent dopant as a bipolar host compound.

<Solar Cell>

Figure 3:
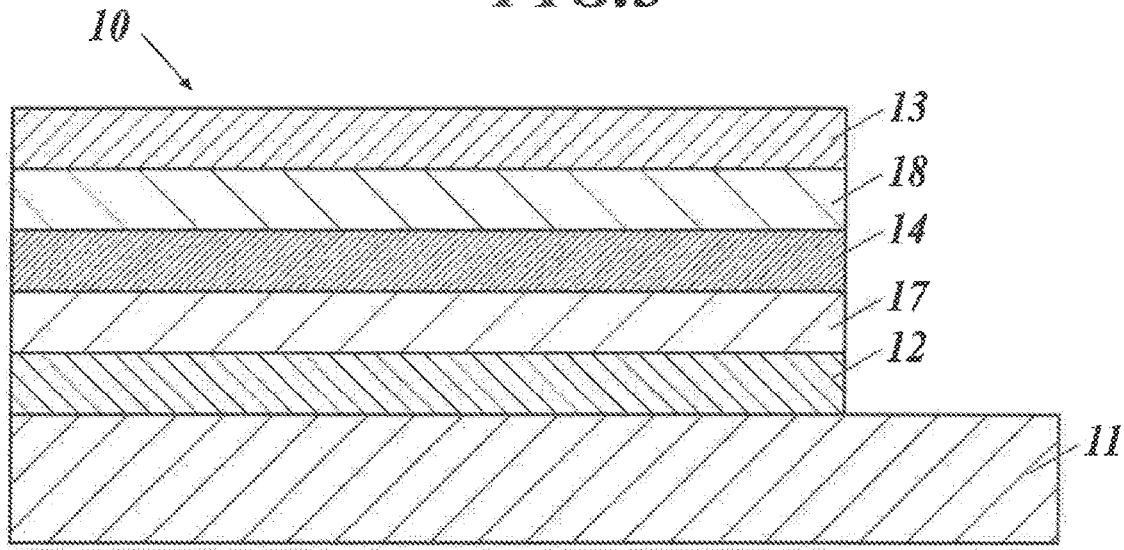

FIG. 3 is a cross-sectional view showing an example of a solar cell having a single structure (having a single bulk heterojunction layer) made of a bulk heterojunction type organic photoelectric conversion element. In FIG. 3, a bulk heterojunction type organic photoelectric conversion element 10 includes a transparent electrode (anode) 12, a hole transport layer 17, a photoelectric conversion portion 14 of the bulk heterojunction layer, an electron transport layer (or a buffer layer) 18, and a counter electrode (cathode) 13 are sequentially laminated on one face of a substrate 11.

The substrate 11 is a member which holds the transparent electrode 12, the photoelectric conversion unit 14, and the counter electrode 13 sequentially laminated. Since the light to be photoelectrically converted is incident from the substrate 11, the substrate 11 is preferably a member that can transmit the light to be photoelectrically converted, that is, a transparent member as for the wavelength of the light to be photoelectrically converted. A glass substrate, a resin substrate, or the like is used as the substrate 11, for example.

The photoelectric conversion unit 14 is a layer that converts light energy into electric energy, and is configured to have a bulk heterojunction layer in which a p-type semiconductor material and an n-type semiconductor material are uniformly mixed. The p-type semiconductor material relatively functions as an electron donor (donor), and the n-type semiconductor material relatively functions as an electron acceptor (acceptor). Here, the electron donor and the electron acceptor are "an electron donor and an electron acceptor where electrons move from an electron donor to an electron acceptor when absorbing light to form a hole and electron pair (charge separation state)." That is, the electron donor and the electron acceptor do not simply donate or accept electrons like electrodes but donate or accept electrons by a photoreaction.

In FIG. 3, the light incident from the transparent electrode 12 through the substrate 11 is absorbed by the electron acceptor or the electron donor in the bulk heterojunction layer of the photoelectric conversion unit 14, so that electrons are transported from the electron donor to the electron acceptor to form a hole and electron pair (charge separation state). If the internal electric fields (for example, the work function of the transparent electrode 12 and the counter electrode 13) are different, depending on the potential difference between the transparent electrode 12 and the counter electrode 13, the generated electric charge is carried to the electrodes, so that the photocurrent is detected. Electrons and holes respectively pass through the electron acceptor and the electron donor to be transported to different electrodes. For example, when the work function of the transparent electrode 12 is larger than the work function of the counter electrode 13, electrons are transported to the transparent electrode 12 and holes are transported to the counter electrode 13. When the magnitude of the work function is reversed, electrons and holes are transported to the opposite direction. In addition, by applying a potential between the transparent electrode 12 and the counter electrode 13, it is possible to control the transporting direction of electrons and holes.

The compound of the present invention easily conducts electron because the distance between triarylboranes, especially between boron atoms, is short. Therefore, in solar cells, especially in organic solar cells, it is effective to apply the compound as a heterojunction type n-type material.

For example, the compound can be used for a heterojunction type solar cell formed by laminating an n-type layer and a p-type layer as in an organic EL, and for a bulk heterojunction type solar cell in which an n-type compound and a p-type compound coexist in the photoelectric conversion unit 14 and the area of the p/n interface is increased by the sea-island structure. In the bulk heterojunction type solar cell, both the p-type material and the n-type material may be composed of low molecular weight materials or either of them may be made of a polymer material.

<Transistor>

For the same reason as the solar cell, the compound of the present invention is preferably used as a material for an n-channel drive type transistor. The compound of the present invention is characterized in that it can be handled thermally stably even if there is no substituent having steric hindrance around the boron atom, and, particularly when it is in a crystalline state, has a completely planar structure like the X-ray diffraction image of B3. Therefore, the compound exerts mutual help effects between molecules more effectively by crystallization, and becomes a more stable electronic device material. From such a viewpoint, the compound of the present invention is preferably a low molecular weight compound than a high molecular weight compound, particularly a symmetric low molecular weight compound, when applied to a transistor.

<Electrode and Charge Transferable Thin Film>

In the compound of the present invention, electron-hopping conduction due to the electron deficiency of a boron atom is likely to occur, so that, when a thin film is formed with the compound itself, it is basically a thin film which conducts electrons.

The compound of the present invention is characterized by maintaining planarity due to its strong sp$^2$ property, however, since electron-deficient boron atoms exist on a plane as well, the compound has high affinity with Lewis basic substances. The compound may have conductivity by adding or coexisting with the following: an alkali metal or an alkaline earth metal which easily releases electrons, other metals such as silver, copper, nickel, iron, cobalt, and the like. Therefore, it can also be applied to a reflective electrode, a transparent electrode, a semi-transmissive electrode, and the like by a structure laminated with the metal, coexisting with the metal, or in which the metal is laminated on a film coexisting with the metal.

<<Advantage and Development of Triarylborane of the Present Invention>>

Until now, a triarylborane has a high potential in terms of electrochemistry but has not been practically used at all due to a big problem in terms of durability particularly in an environment in the air, under high temperature, at the time of electric field application, and the like. The greatest significance of the present invention is that it is possible to create a compound with far more improved durability than the conventional triarylborane by a simple and reasonable solution of shortening the bond distances of boron-carbon bonds in the triarylborane.

The compound of the present invention can be developed. If the bond distances of boron-carbon bonds in the triarylborane satisfy 1.48 Å or less, the durability is universally improved and the characteristics of the electron conductivity and the electron withdrawing property derived from the boron compound can be utilized. As a result, it is possible to apply the compound to various industrial products. It can be said that this is an unprecedented technological progress and an essential invention that have never been seen before.

EXAMPLES

Hereinafter, the present invention will be specifically described with reference to examples, but the present invention is not limited thereto. The expression "part" or "%" used in the examples means "parts by weight" or "% by weight", unless otherwise specified.

In order to obtain the compound B3 of the present invention, the following three routes were devised. In these routes, first, each triphenylborane derivative is prepared as a precursor of B3, and the target compound is obtained by an intramolecular cyclization reaction at three, two, and one portion(s).

Scheme 3 (Comparative example 1)

[Chem 32]

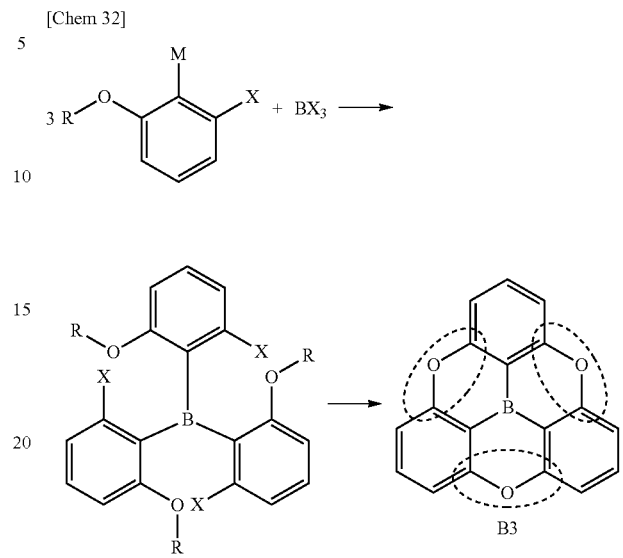

Scheme 4

(Comparative example 2)

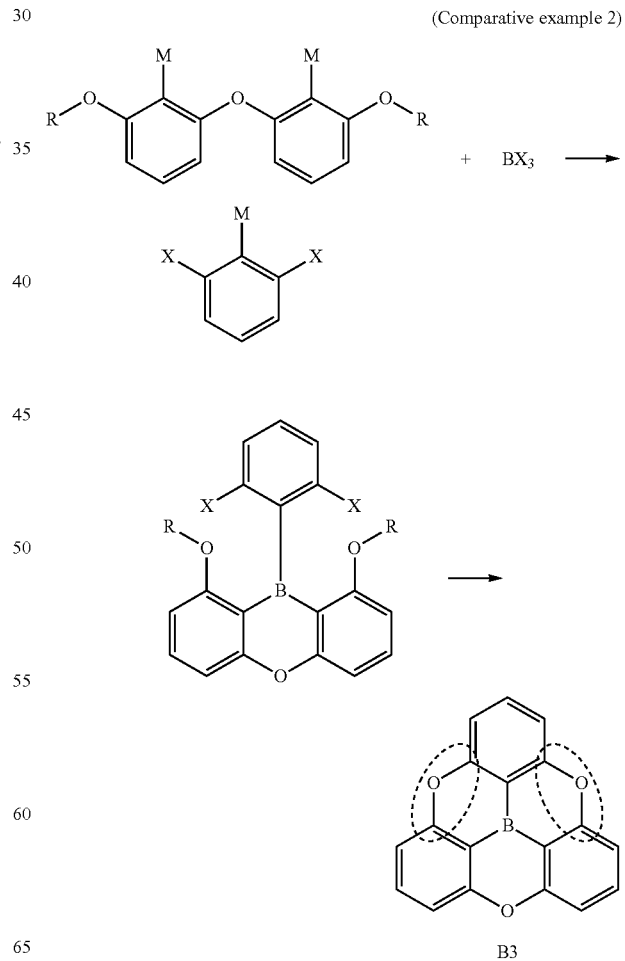

Scheme 5

(Example 1)

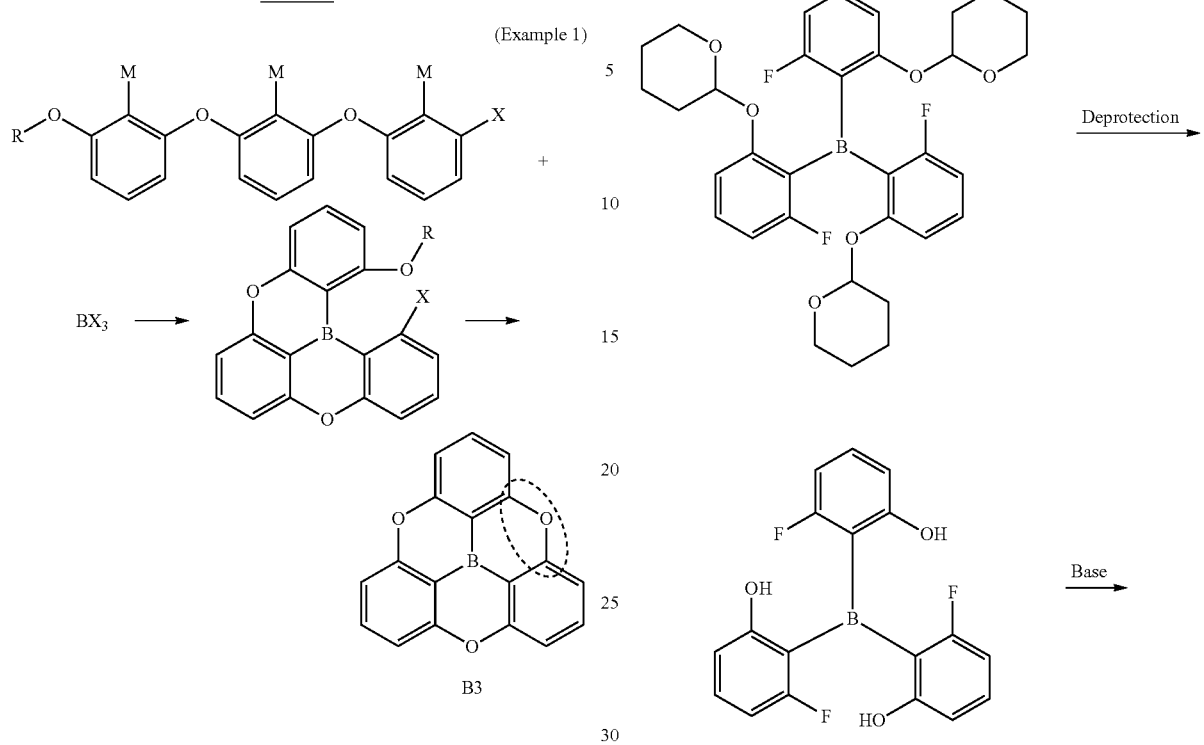

1. Comparative Example 1

Scheme 3: Route for Synthesizing the Object by Carrying Out Intramolecular Cyclization Reactions at Three Portions In order to synthesize the compound B3 of the present invention, the following route for synthesizing the object by intramolecular cyclization reactions at three portions was tested. This is based on the route reported for synthesizing Comparative Compound P1 having a phosphorus atom in the center.

[Chem 33]

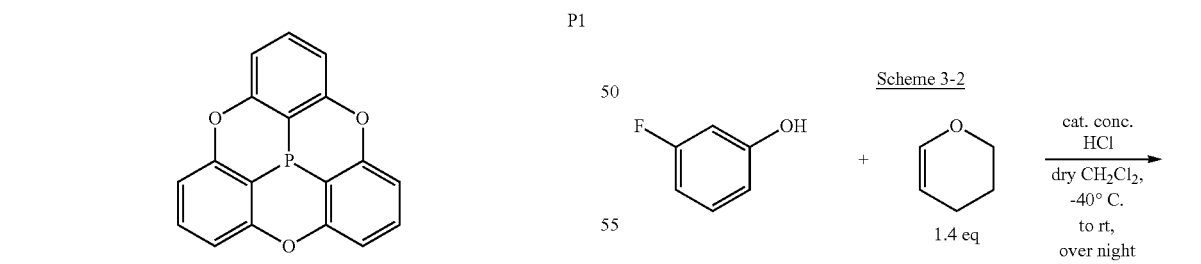

P1

Scheme 3-2

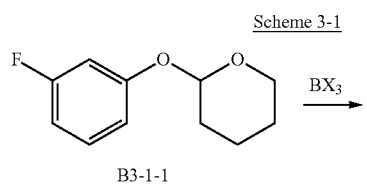

Scheme 3-1

Scheme 3-3

[Chem 34]

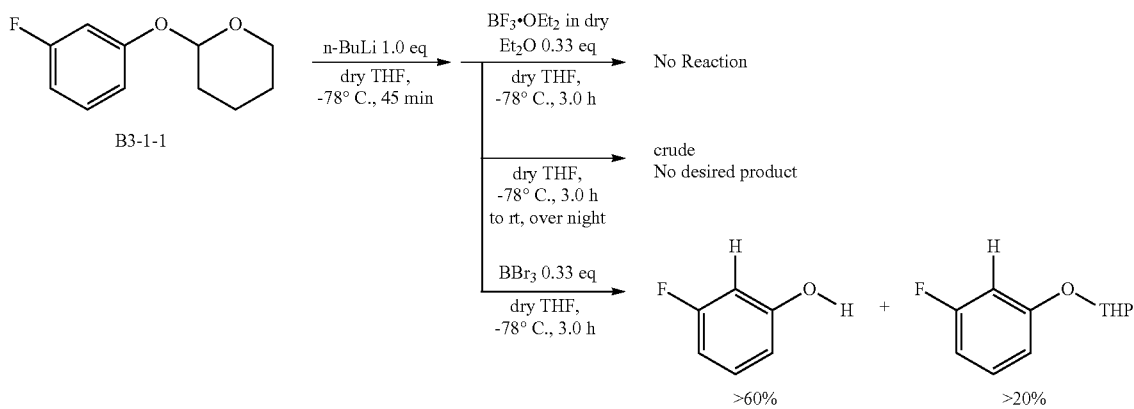

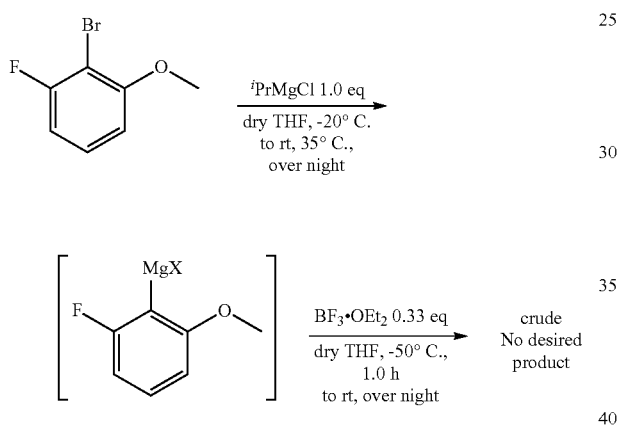

The present inventors synthesized the compound B3-1-1 in which the OH group was protected with a tetrahydropyranyl group, to obtain the object in a yield of 92%. Subsequently, the present inventors tested triborylation using n-BuLi and triborylation using a Grignard reagent using this B3-1-1 as a raw material, but in either case, but could not be synthesize the object.

2. Comparative Example 2

Scheme 4: Route for Synthesizing the Object by Carrying Out Intramolecular Cyclization Reactions at Two Portions In order to synthesize the compound B3 of the present invention, the following route for synthesizing the object by intramolecular cyclization reactions at two portions was tested. This is based on the route reported for synthesizing Comparative Compound B3a having a 1,1-dimethylmethylene group linking the 2,6-positions of all three phenyl groups of the triphenylborane.

[Chem 35]

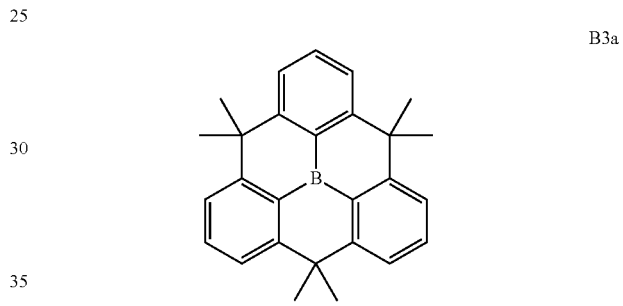

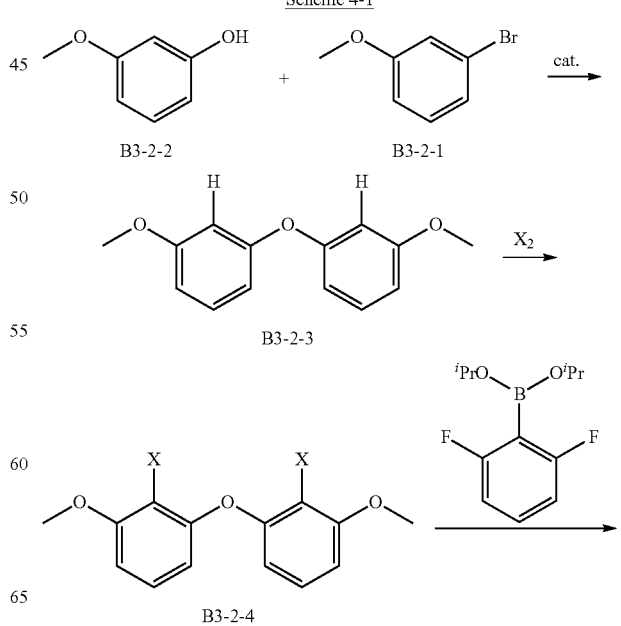

Scheme 4-2
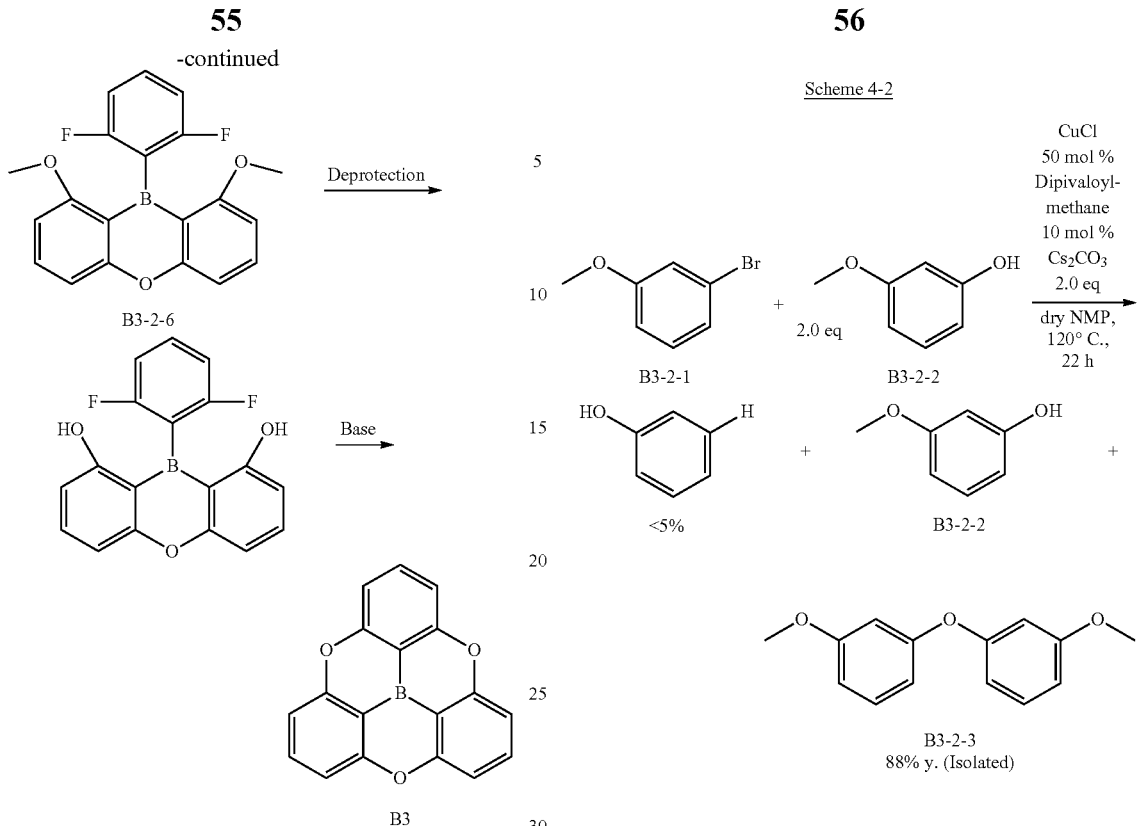
The object compound B3-2-3 was synthesized using B3-2-1 and B3-2-2 as mw materials and a copper catalyst.
Scheme 4-3
[Chem 36]
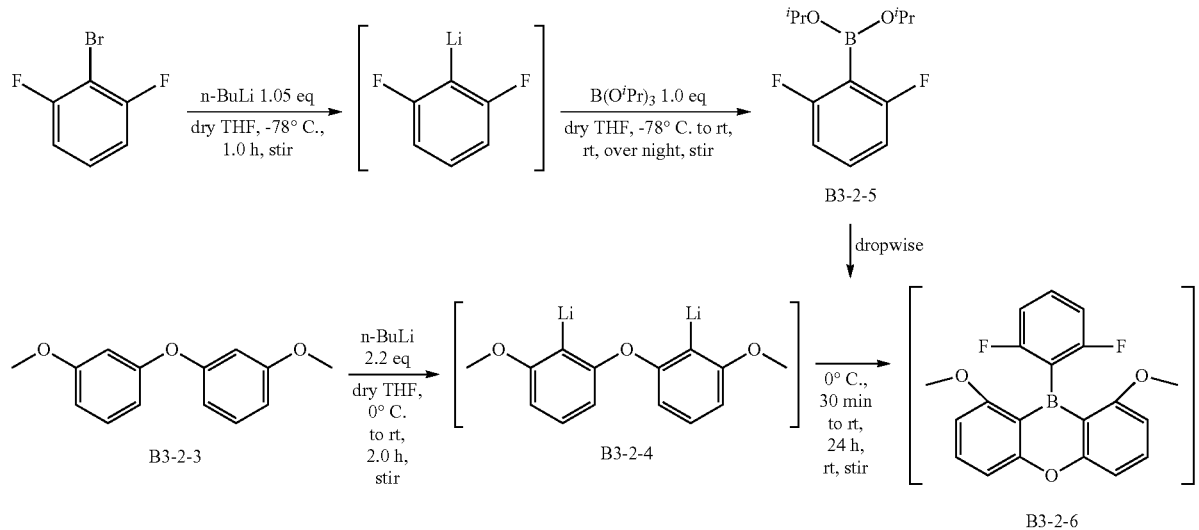
Subsequently, the dilithiation reaction of B3-2-3 was carried out to prepare a reaction intermediate B3-2-4, and then diisopropyl (2,6-difluorophenyl) boronic acid, B3-2-5, was added dropwise to obtain a reaction intermediate B3-2-6.

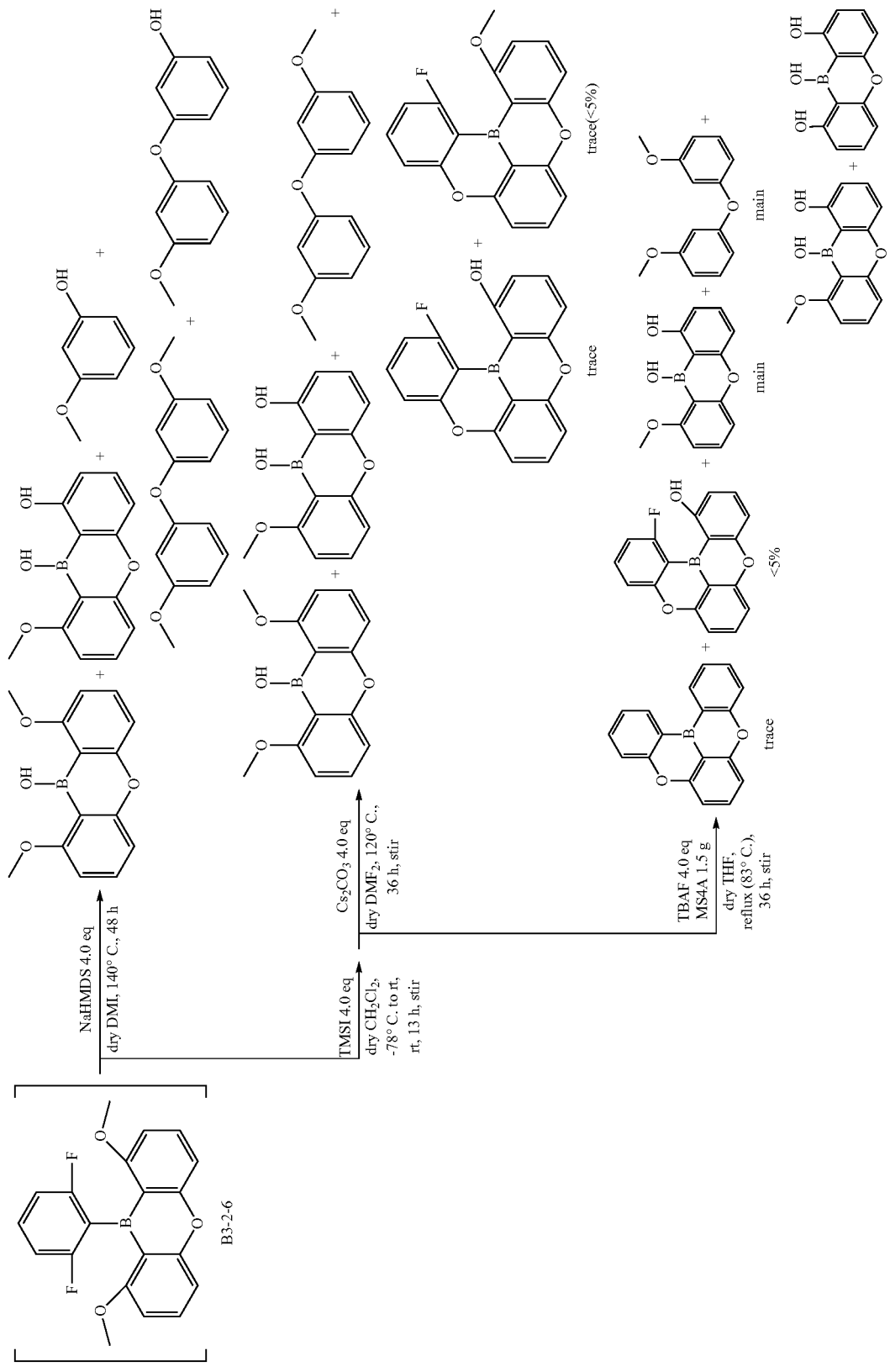
Scheme 4-4

Next, without isolating the reaction intermediate B3-2-6, intramolecular cyclization reaction of the next step was investigated. First, deprotection of the methoxy group and intramolecular cyclization reaction using sodium bis (trimethylsilyl) amide (NaHMDS) were tested, but no object was obtained.

Next, after deprotection with trimethylsilylimidazole (TMST) which is a Lewis acid, intramolecular cyclization reaction was tested using $Cs_2CO_3$ and tetrabutylammonium fluoride (TBAF). As a result, it was possible to confirm the trace of the compound having a structure having one side cyclized and close to the object B3.

Therefore, the protecting group was changed from a methoxy group to a silyl ether group.

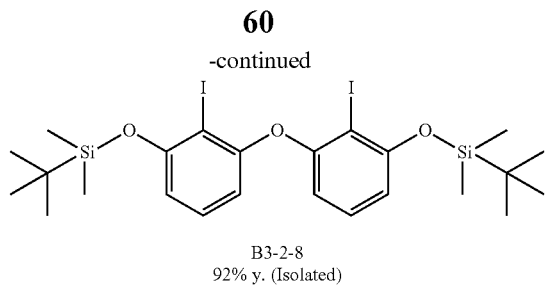

B3-2-8
92% y. (Isolated)

Scheme 4-5

[Chem 38]

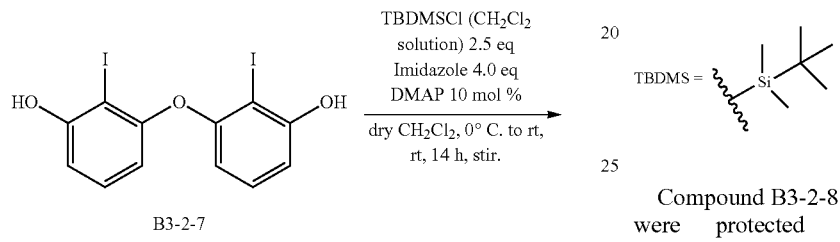

Compound B3-2-8 was synthesized, in which OH groups were protected with tert-butyldimethylchlorosilane (TBDMSCl) using B3-2-7 as a raw material.

Scheme 4-6

[Chem 39]

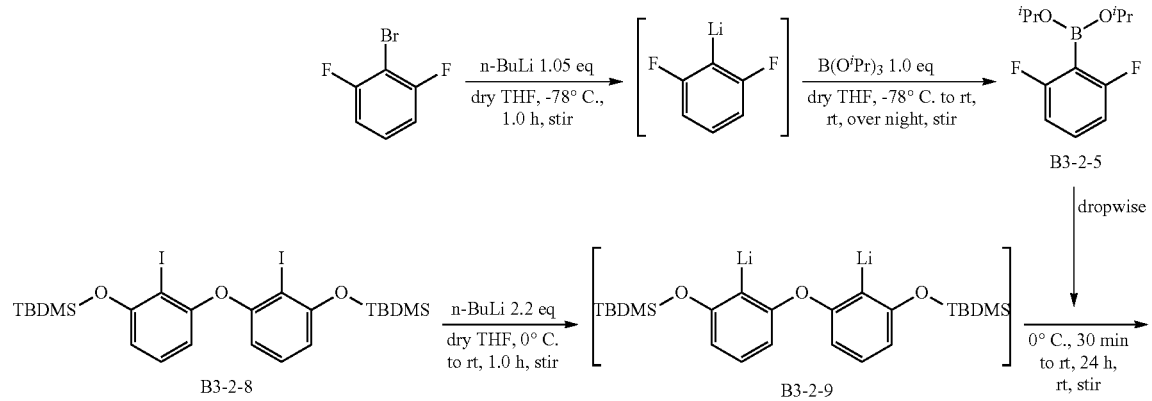

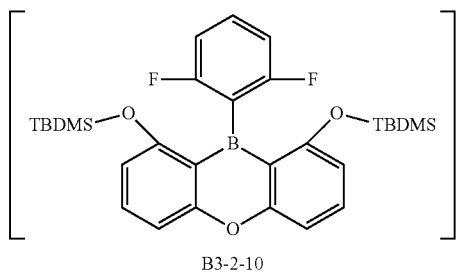

B3-2-10

Subsequently, the dilithiation reaction of B3-2-8 was carried out to prepare a reaction intermediate B3-2-9, and then diisopropyl(2,6-difluorophenyl)boronic acid, B3-2-5, was added dropwise to obtain a reaction intermediate B3-2-10.

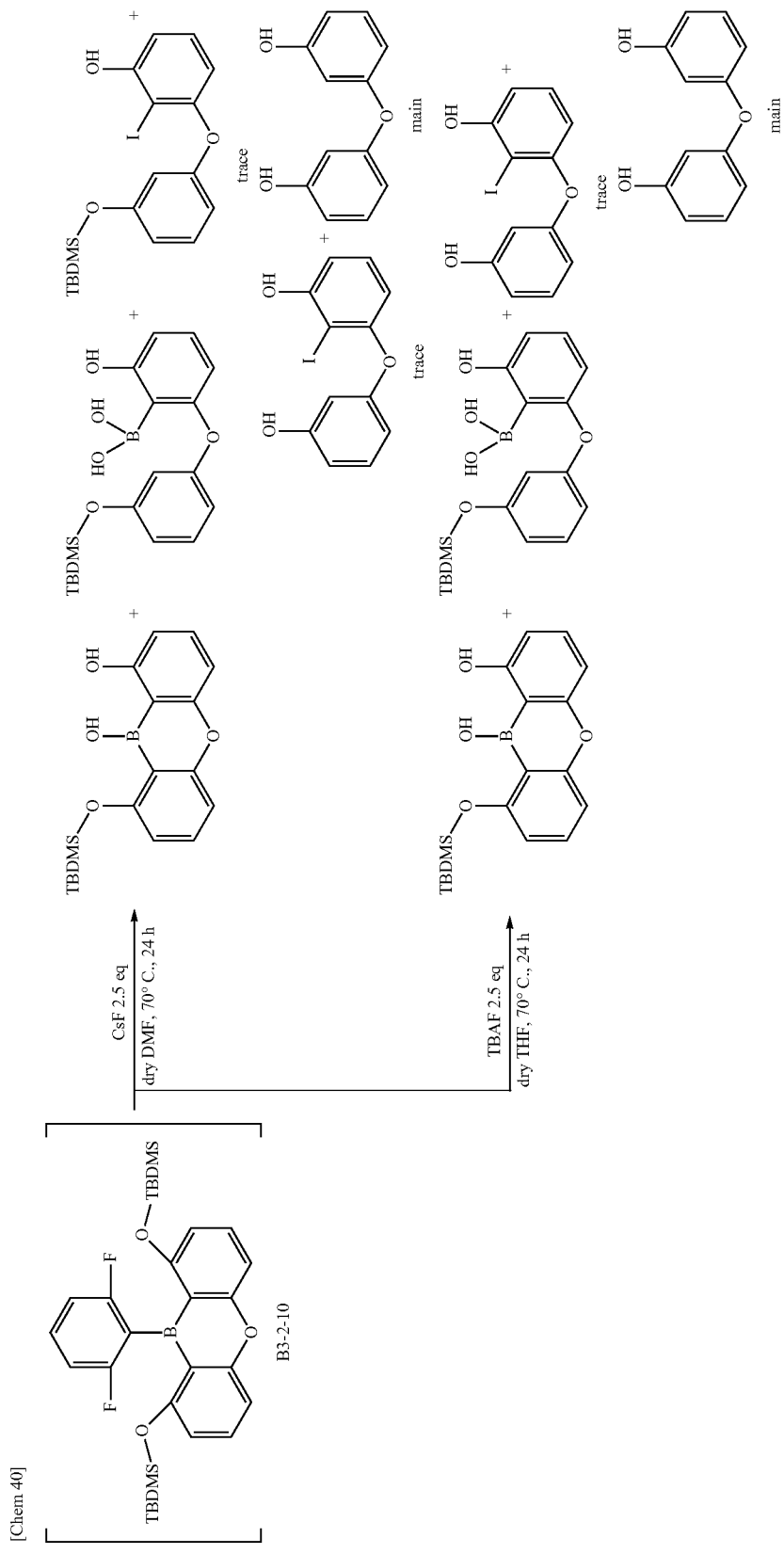
Scheme 4-7

Next, the intramolecular cyclization reaction in the next step was investigated without isolating the reaction intermediate B3-2-10. Deprotection and intramolecular cyclization reaction were tested using CsF and TBAF. As a result, deprotection seemed more likely to proceed than the methoxy group, and many cyclization products could be confirmed but it was still not the main component.

As for the routes shown in Comparative Example 1 and Comparative Example 2, the reasons why the intramolecular cyclization reaction did not progress in good yield and even a trace of the target compound B3 was not observed were presumed as follows.

In the deprotection of a methoxy group or a silyl group, if a nucleophilic species such as a fluoride ion is present in the system, the boron atom can form an ate complex with $sp^3$ property with the nucleophile. Along with this, the boron-carbon bonds become weaker so that cleavage of the bonds and elimination of boron proceed in due course. Therefore, it seems that the intended cyclization product could not be obtained.

Scheme 4-8

[Chem 41]

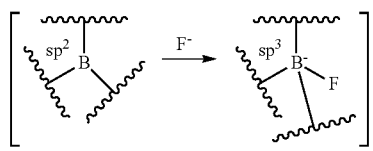

3. Example 1

Synthesis Example

Scheme 5: Route for Synthesizing the Object by Carrying Out Intramolecular Cyclization Reaction at One Portion In order to synthesize the compound B3 of the present invention, the following route for synthesizing the object by intramolecular cyclization reactions at one portion was tested.

Scheme 5-1

[Chem 42]

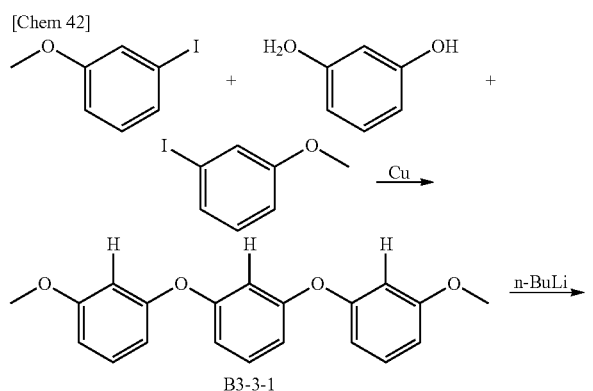

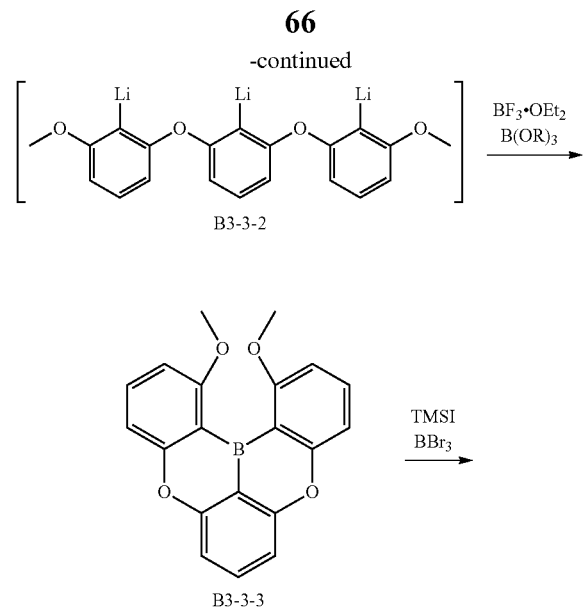

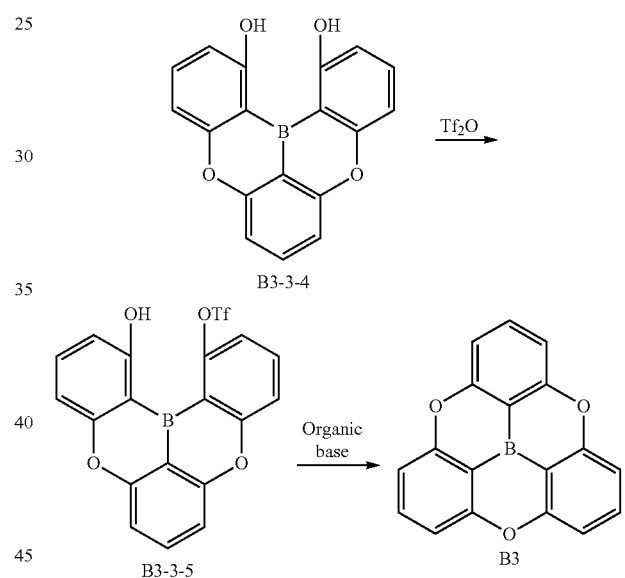

Scheme 5-2

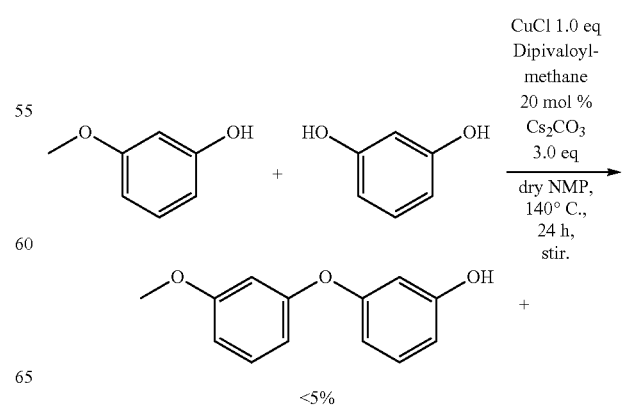

-continued

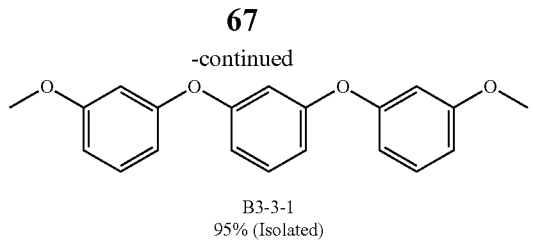

B3-3-1
95% (Isolated)

An etherification reaction conducted using 1-iodo-3-methoxybenzene and 1,3-dihydroxybenzene as raw materials and a copper catalyst. A triphenyl ether compound B3-3-1 was obtained in a high yield.

Scheme 5-3

[Chem 43]

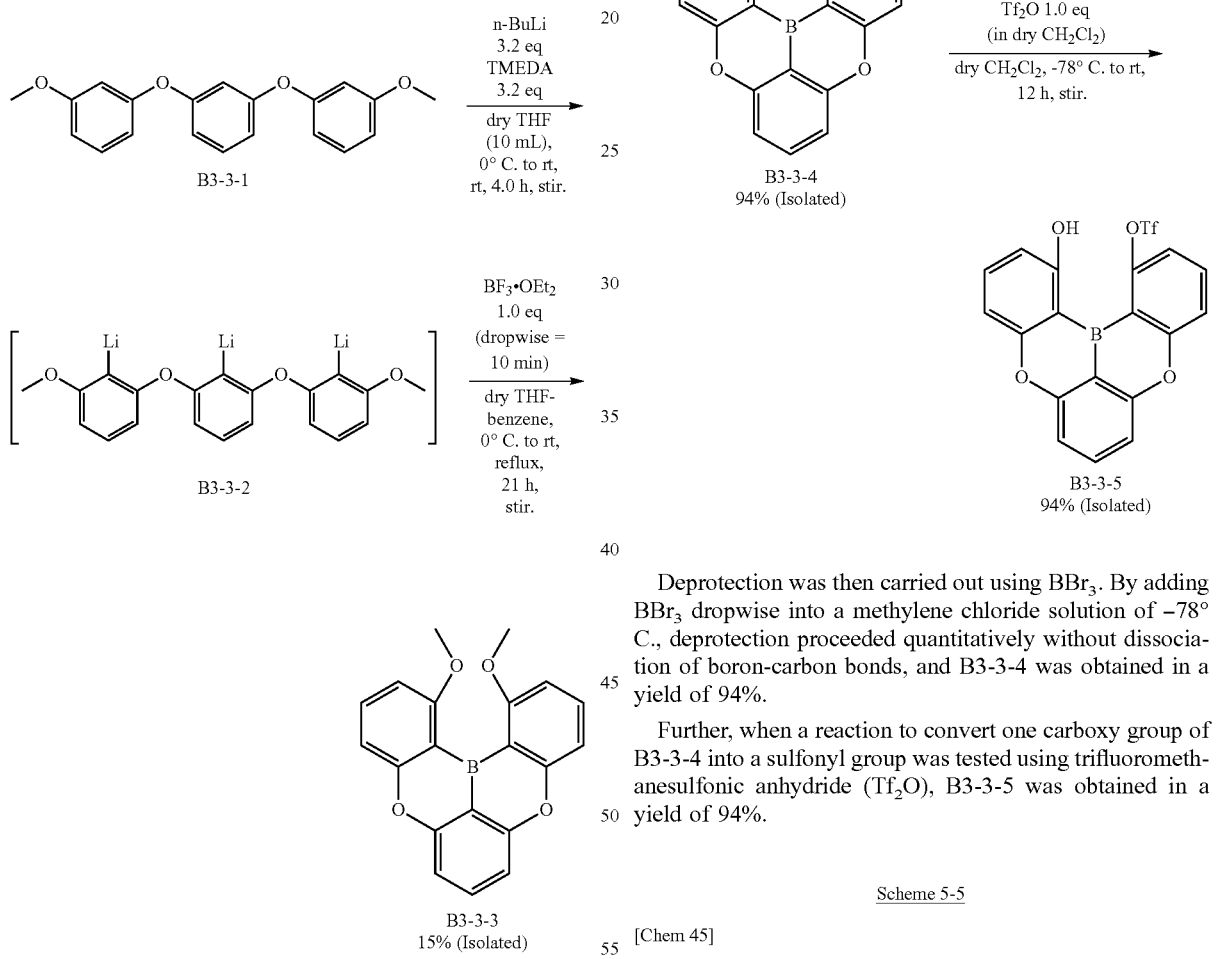

Next, n-BuLi was added dropwise to B3-3-1 to test a trilithiation reaction. It was confirmed that B3-3-2 was obtained as a reaction intermediate.

Subsequently, a borylation reaction was tested. The THF/benzene mixed solution of B3-3-2 to which one equivalent of $BF_3/OEt_2$ was added dropwise over 10 min was heated and refluxed for 21 hours. After that, reaction treatment and purification were carried out to obtain B3-3-3 in a yield of 15%.

Scheme 5-4

[Chem 44]

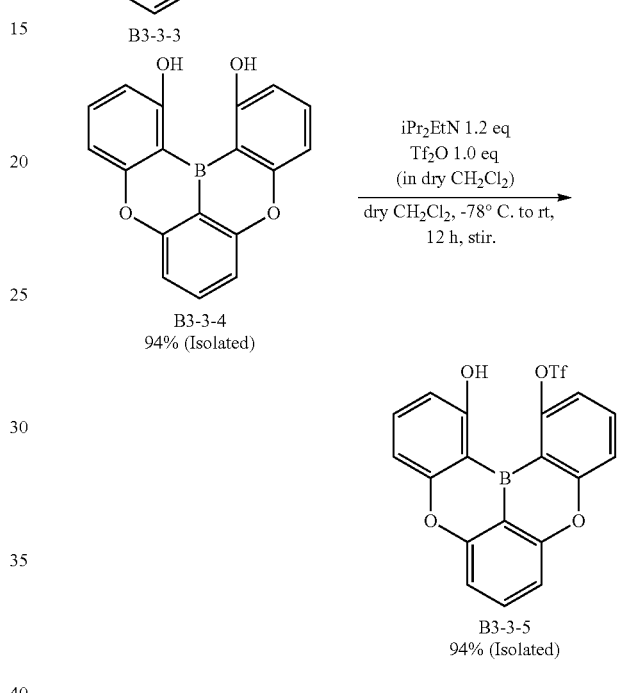

Deprotection was then carried out using $BBr_3$. By adding $BBr_3$ dropwise into a methylene chloride solution of −78° C., deprotection proceeded quantitatively without dissociation of boron-carbon bonds, and B3-3-4 was obtained in a yield of 94%.

Further, when a reaction to convert one carboxy group of B3-3-4 into a sulfonyl group was tested using trifluoromethanesulfonic anhydride ($Tf_2O$), B3-3-5 was obtained in a yield of 94%.

Scheme 5-5

[Chem 45]

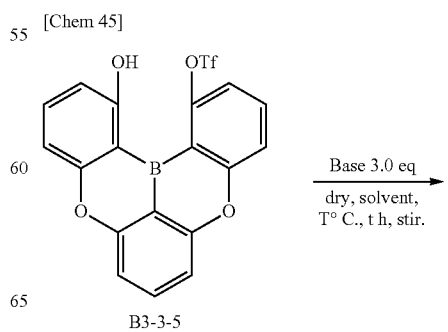

B3-3-5

Base 3.0 eq
dry, solvent,
T° C., t h, stir.

-continued

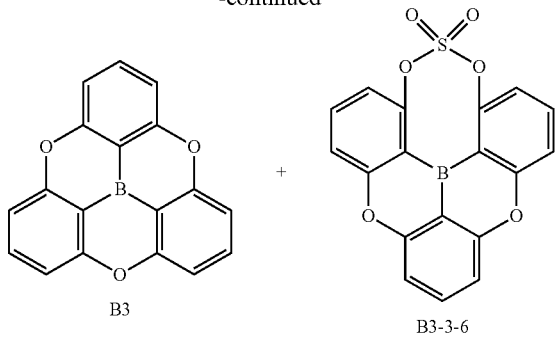

B3

B3-3-6

Finally, an intramolecular nucleophilic substitution reaction of B3-3-5 was performed using an organic strong base for the purpose of synthesizing the object B3 of the present invention.

When optimization conditions were examined by changing the base, solvent, reaction time (th), reaction temperature (T ° C.), and the like, it was possible to finally confirm the formation of the object B3 under any conditions. B3-3-6 crosslinked by a sulfonyl group was also confirmed as a by-product. The above results are shown in Table 1.

TABLE 1

| No. | Organic base | Temperature T [° C.] | Solvent | Reaction time t [hour] | Yield [%] B3 | B3-3-6 |
|---|---|---|---|---|---|---|
| 1 | DBU | 120 | DMF | 24 | 65 | 30 |
| 2 | DBN | 120 | DMF | 20 | 60 | 34 |
| 3 | MTBD | 120 | DMF | 20 | 44 | 22 |
| 4 | DBU | 160 | DMF | 20 | 73 | 26 |
| 5 | DBU | 160 | DMSO | 20 | 53 | 36 |
| 6 | DBU | 240, MW | DMF | 4 | 87 | N.D. |

[Chem 46]

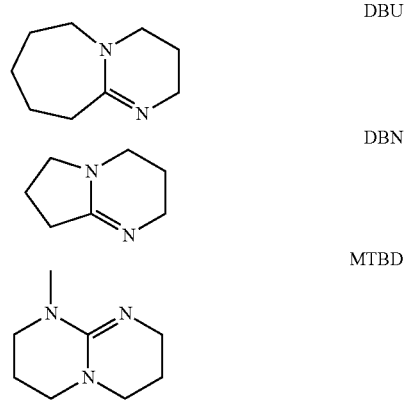

According to Table 1, the condition for obtaining B3 in highest yield and suppressing the by-product B3-3-6 was the condition No. 6. Under this condition, the reaction is carried out at 240° C. for 4 hours using DBU as an organic base, DMF as a solvent, and a microreactor using microwave (MW).

A summary of the synthesis scheme of B3 is shown below.

Scheme 5-6

[Chem 47]

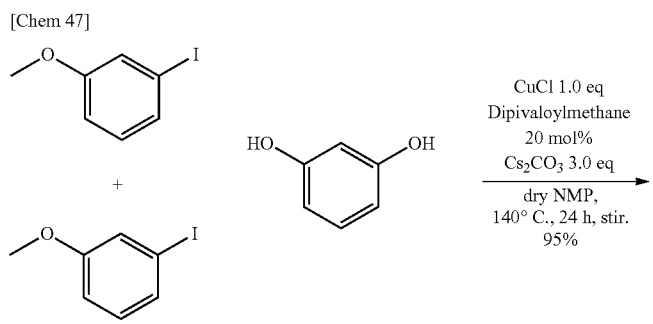

CuCl 1.0 eq
Dipivaloylmethane 20 mol%
Cs$_2$CO$_3$ 3.0 eq
dry NMP,
140° C., 24 h, stir.
95%

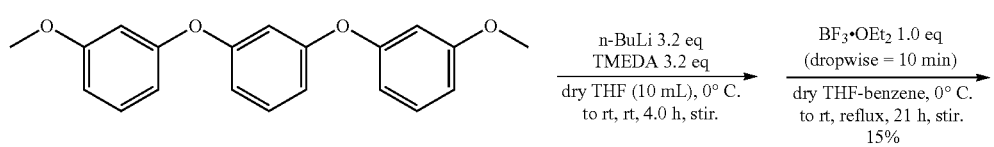

n-BuLi 3.2 eq
TMEDA 3.2 eq
dry THF (10 mL), 0° C.
to rt, rt, 4.0 h, stir.

BF$_3$·OEt$_2$ 1.0 eq
(dropwise = 10 min)
dry THF-benzene, 0° C.
to rt, reflux, 21 h, stir.
15%

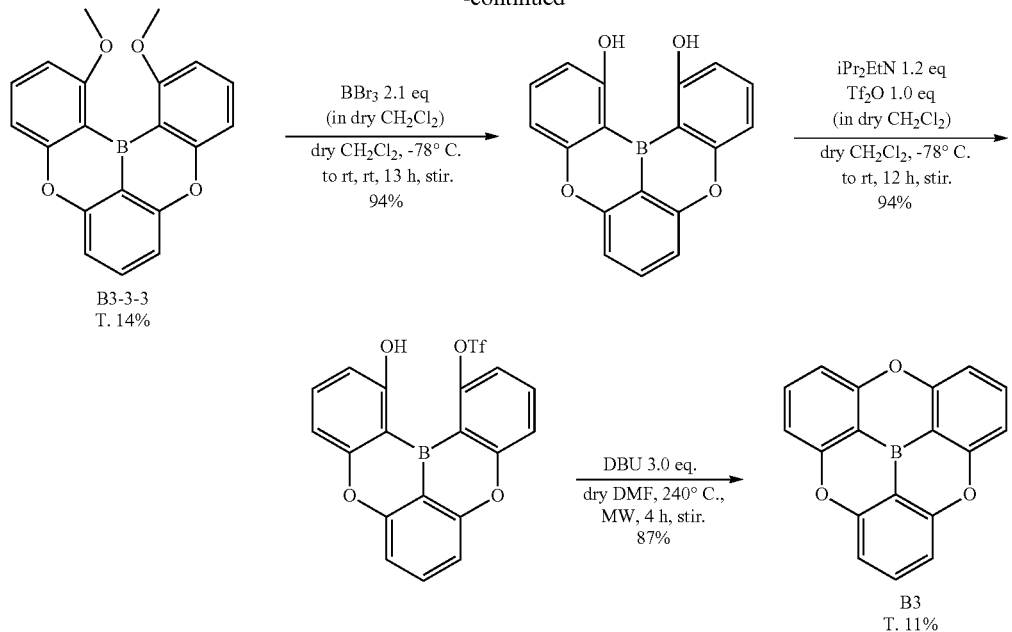

4. Example 2

X-Ray Single Crystal Structure Analysis

It is described that the compound of the present invention is excellent in stability and suitable for charge transporting property, on the basis of the X-ray single crystal structure of B3-3-3 obtained for discussing its structure, intermolecular distance, and packing state.

Figure 8:
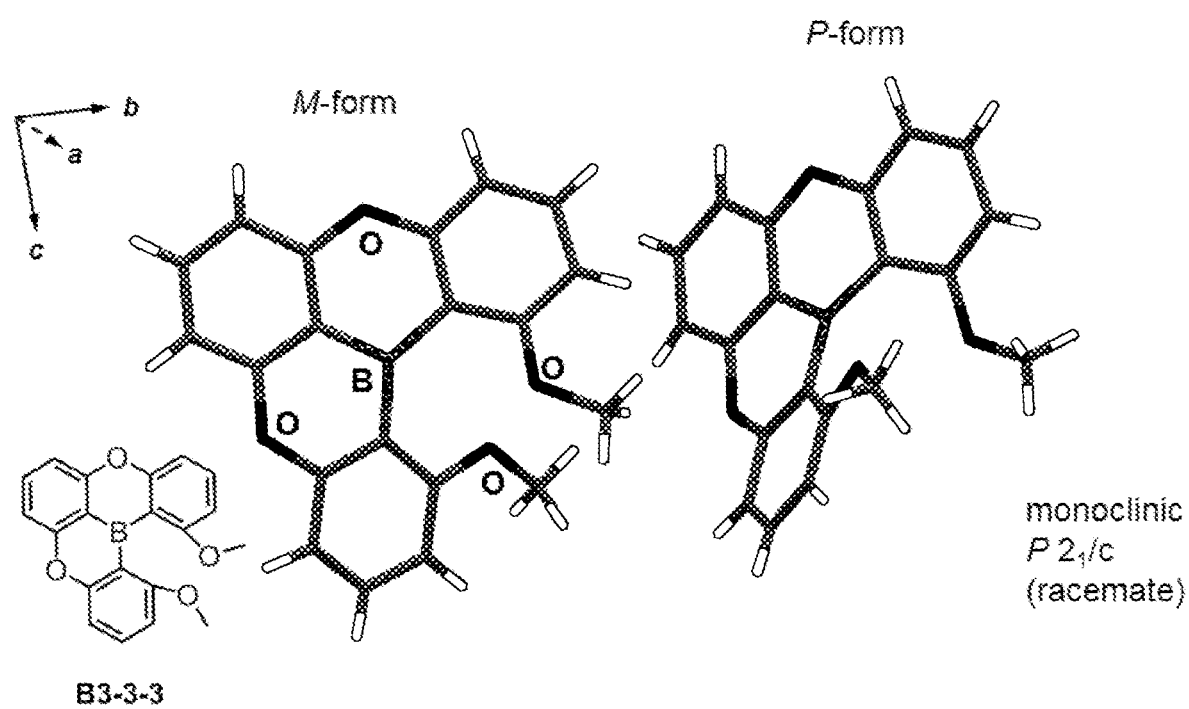
FIG. 8 An X-ray single crystal structure of a dimethoxy form B3-3-3

First, as a comparative example, the X-ray single crystal structure of a dimethoxy form B3-3-3 is shown in FIG. 8.

Because symmetry operation of B3-3-3 crystals includes a glide plane (/c), it is considered that not only molecules of one helicity are crystallized but a racemate is present in the same crystal due to optical resolution during crystallization.

Figure 9:
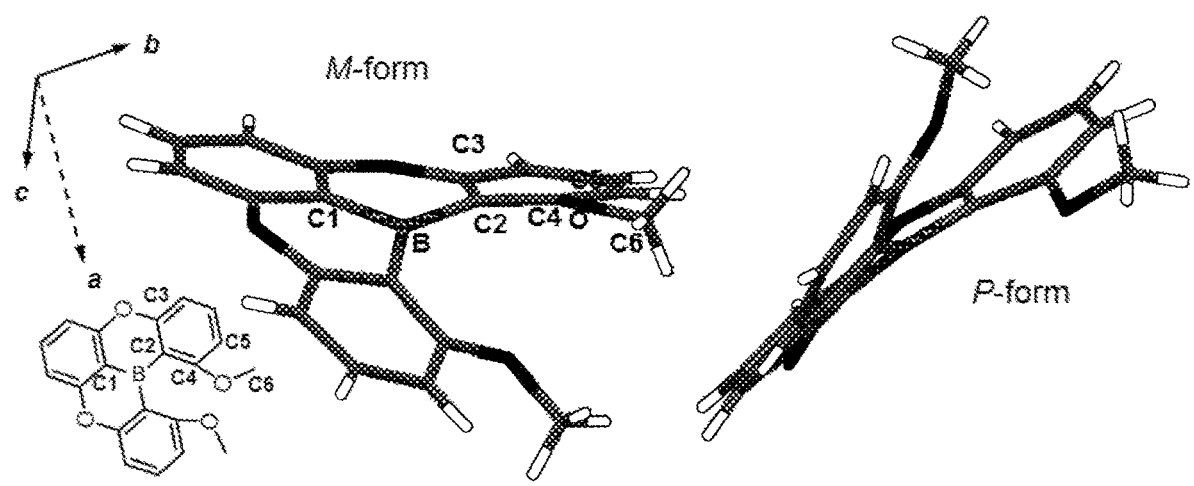
FIG. 9 A torsion angle at a ring-opening portion of B3-3-3

The torsion angle at the ring-opening portion is formed by two phenyl groups respectively protruding upwardly and downwardly which are not oxygen-crosslinked around the boron atom, as shown in FIG. 9. It is considered that oxygen atoms in ortho positions cause steric repulsion.

Figure 10:
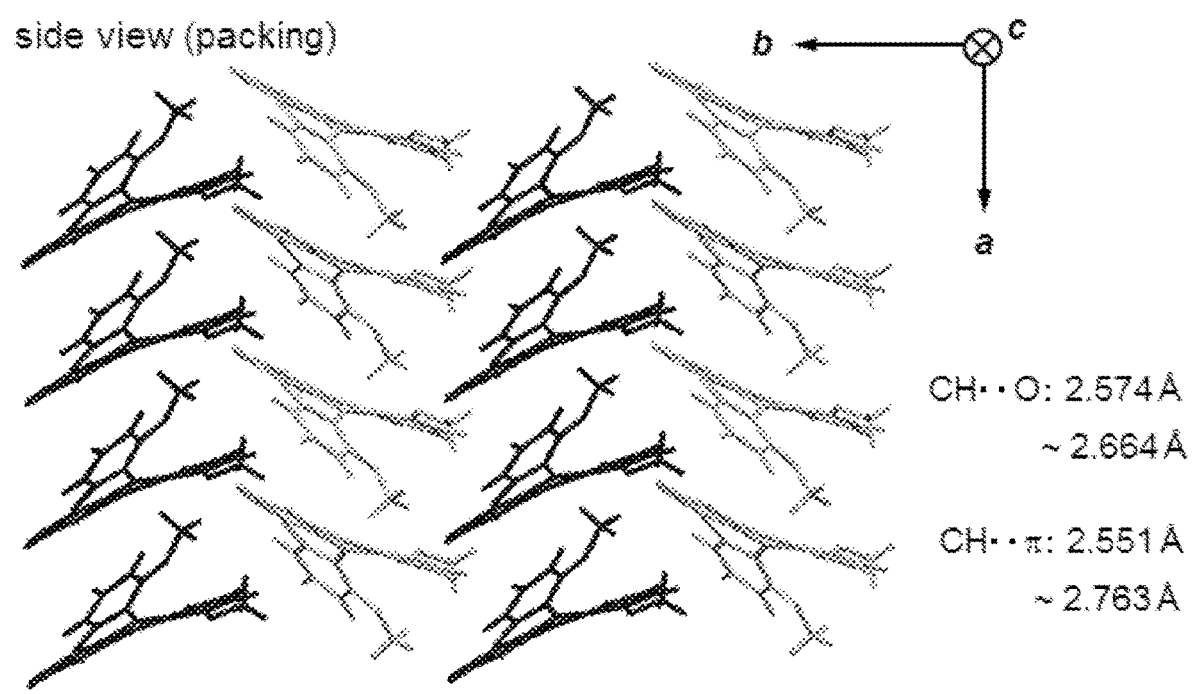
FIG. 10 A packing state of B3-3-3

Focusing on the packing state as shown in FIG. 10, it can be seen that it takes a nearly herringbone structure. Furthermore, focusing on the intermolecular distance, it is the distance at which CH-n, CH-p interactions (weak hydrogen bonds) can work, and it can be said that the crystal structure is constructed by these weak interactions.

Meanwhile, B3 of the present invention is a perfectly planar disk-like compound, and the bond distances of the boron-carbon bonds are all 1.48 Å or less (see FIG. 7.

Figure 11:
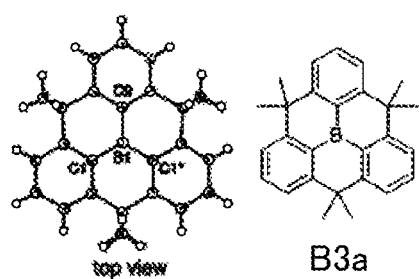
FIG. 11 B3A and Bob
Figure 11:
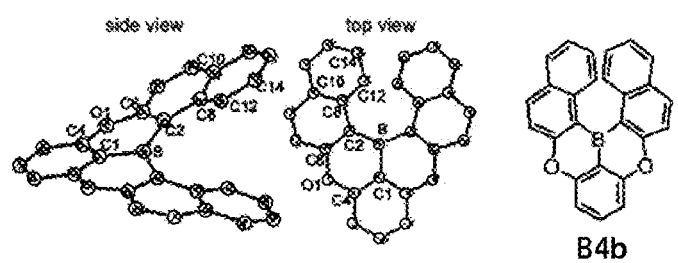

These short bond distances also stands out in comparison with the crystal structures according to prior arts such as B3A (see Non-Patent Document 3) and B4b (H. Hirai, K. Nakajima, S. Nakatsuka, K. Shiren, J. Ni, S. Nomura, T. Ikuta, T. Htakayama, Angew. Chem. Int. Ed., 2015, 54, 15381) shown in FIG. 11. This is because the $sp^2$ property of the boron-carbon bonds is enhanced in B3 by the rigid structure completely cyclized both by the three oxygen crosslinks and by the electron donating effect from the unpaired electron of the oxygen atom to the boron atom.

Figure 12:
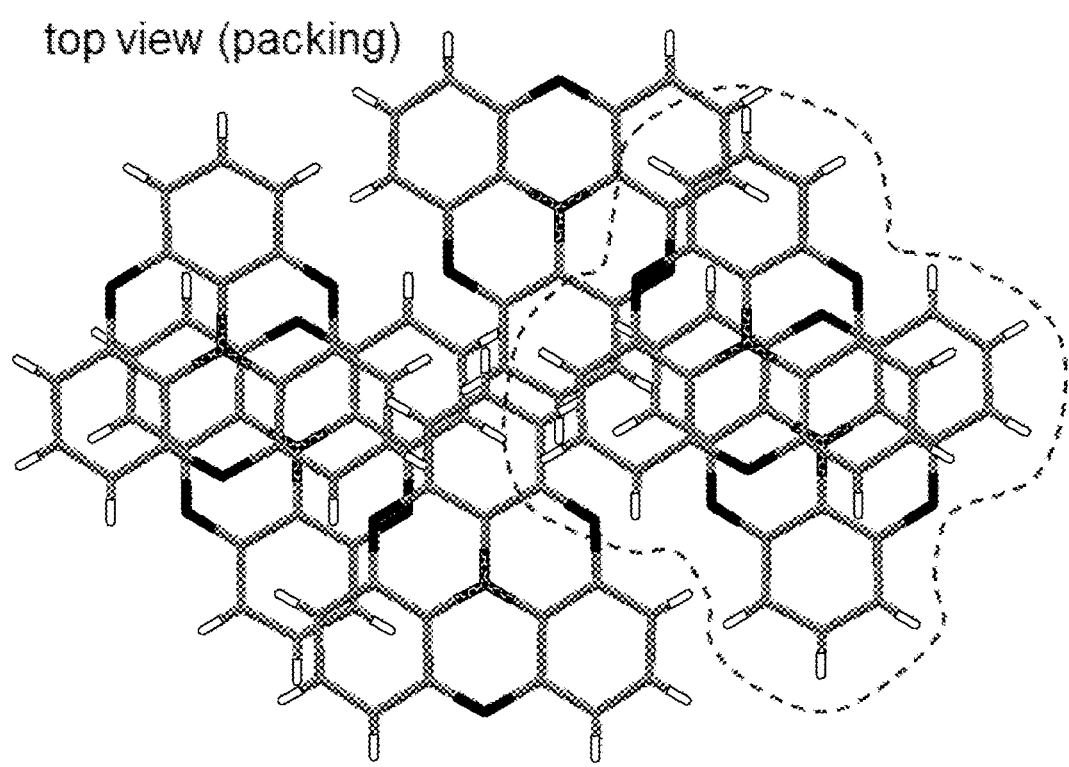
FIG. 12 A top view of B3

Focusing on the top view of B3 as shown in FIG. 12, it can be seen that the planar borans located above and below are not completely overlapping but slightly diagonally displaced. In other words, the molecules construct a crystal structure by π-π stacking of not a face-to-face type but an offset (slipped, parallel diplaced) type.

Figure 13:
FIG. 13 A distance between molecular planes of B3
Figure 13:
Figure 13:
Figure 13:
Figure 13:

Subsequently, focusing on the distance between the molecular planes as shown in FIG. 13, it was clearly found to be 3.374 Å. Since it is within the region of 3.3 to 3.5 Å, it can be said that π-π interaction (London dispersion force) is working.

Figure 6:
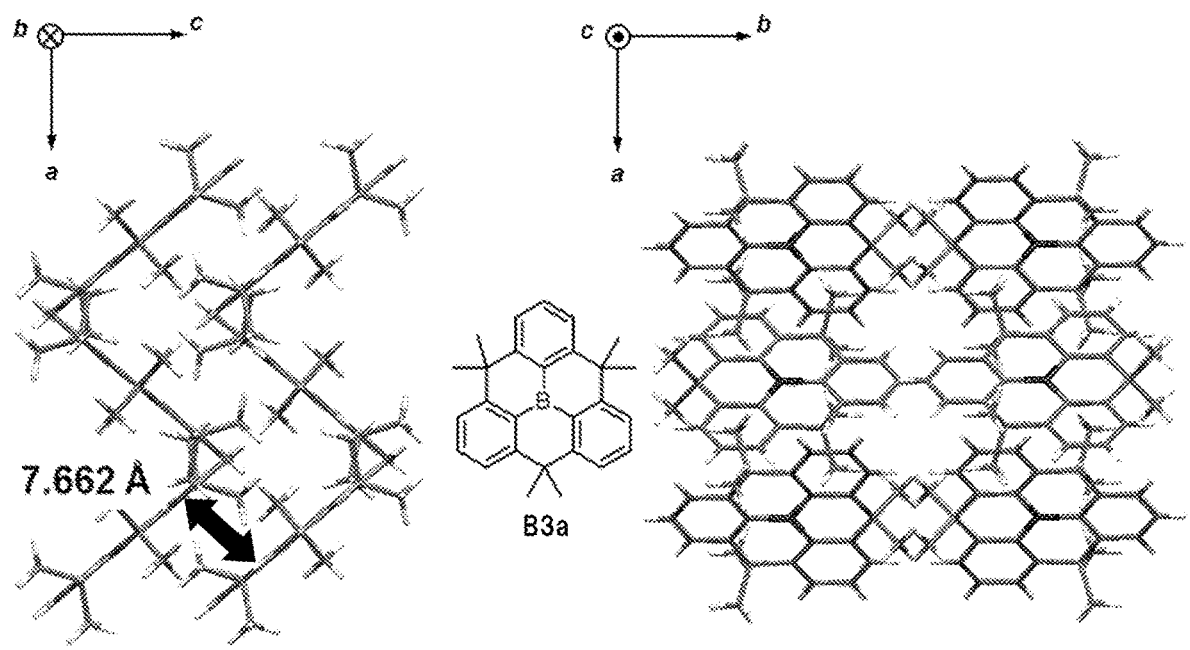

Meanwhile, according to the prior art B3a, the distance between the molecular planes is 7.662 Å, which is considerably longer than B3. This is because the molecules construct a herringbone structure of an edge-to-face type (see FIG. 6.

From the above results, it can be said that the compound B3 of the present invention is a compound having excellent thermodynamic stability and suitable charge transporting property even compared with conventionally known arylborane, because of the short bond distances of the boron-carbon bonds, the perfect planar structure, and the short planar distance between the molecules. They are desired to be used for a charge transport layer of an organic EL device or an organic field effect transistor (OFET).

5. Example 3

Electronic Conductivity by Electron-Only Device

Using the compound B3 of the present invention as an electron transport layer material, an electron-only device was manufactured.

Manufacture of Electron-Only Device

A glass substrate having an ITO (Indium Tin Oxide) layer of 100 nm as an anode was subjected to ultrasonic cleaning with isopropyl alcohol, drying with dry nitrogen gas, and UV ozone cleaning, and fixed on a substrate holder in a vacuum deposition apparatus.

After evacuating the interior of the vacuum deposition apparatus to a vacuum degree of $1\times10^{-4}$ Pa, calcium was vapor-evaporated on the anode to form a layer of calcium having a thickness of 5.0 nm.

Next, the compound B3 of the present invention was evaporated to provide an electron transport layer of 120 nm. Next, lithium fluoride (0.5 nm) as an electron injection layer and aluminum (100 nm) as a cathode were vapor-evaporated in this order to manufacture an electron-only device.

By applying a driving voltage of 5.0 V to the obtained electron-only device at room temperature, current flow was confirmed. From this result, it was confirmed that B3 of the present invention has electronic conductivity.

6. Example 4

Comparison of Thermal Analysis Results

B3 of the present invention and trimesityborane were respectively put in different glass sealed tubes and heated to 300° C. After heating at 300° C. for 1 hour, B3 was taken out of the glass tube and subjected to $^1$H-NMR measurement. It was confirmed B3 was not decomposed at all.

Meanwhile, it was confirmed that about 20% of trimesityborane was decomposed according to $^1$H-NMR measurement after heating at 300° C. for 1 hour.

From the above results, it was found that the compound B3 of the present invention has sufficient thermal stability as compared with conventionally known borane.

7. Example 5

Use as an Electron Transport Material in an Organic E1 Device

The compound B3 of the present invention was used as an electron transport layer material to manufacture an organic EL device.

Manufacture of Organic EL Device

A glass substrate having an ITO (Indium Tin Oxide) layer of 100 nm as an anode was subjected to ultrasonic cleaning with isopropyl alcohol, drying with dry nitrogen gas, and UV ozone cleaning, and fixed on a substrate holder in a vacuum vapor evaporation apparatus.

After evacuating the interior of the vacuum vapor evaporation apparatus to a vacuum degree of $1\times10^{-4}$ Pa, on the anode were formed hexacyanohexaazatriphenylene (15 nm) as a hole injection layer and α-NPD (4,4'-bis[N-(1-naphthyl)-N-phenylamino] biphenyl) (30 nm) as a hole transport layer in this order.

Next, a light emitting layer having a thickness of 30 nm was provided by vapor co-evaporation of 1,3-Bis(N-carbazolyl)benzene (mCP), which is a host compound, and Bis [2-(4,6-difluorophenyl)pyridinato-$C^2$, N] (picolinato) iridium (III) (FIrpic), which is a light emitting dopant, at the ratio of mCP:FIrpic=100:6.

Next, compound B3 (15 nm) of the present invention as an electron transport layer, lithium fluoride (1.0 nm) as an electron injection layer, and aluminum (100 nm) as a cathode were vapor-evaporated in this order to manufacture an organic EL device.

When a constant current of 2.5 mA/cm$^2$ was passed through the obtained organic EL element at room temperature, blue light was emitted. From these results, it was confirmed that B3 of the present invention functions as an electron transport material in the organic EL element, and B3 revealed to have high electron conductivity.

8. Example 6

Use as a Light Emitting Material in an Organic EL Device

The compound B3 of the present invention was used as a light emitting material to manufacture an organic EL device.

Manufacture of Organic EL Device

A glass substrate having an ITO (Indium Tin Oxide) layer of 100 nm as an anode was subjected to ultrasonic cleaning with isopropyl alcohol, drying with dry nitrogen gas, and UV ozone cleaning, and fixed on a substrate holder in a vacuum vapor evaporation apparatus.

After evacuating the interior of the vacuum vapor evaporation apparatus to a vacuum degree of $1\times10^{-4}$ Pa, on the anode were formed hexacyanohexaazatriphenylene (12 nm) as a hole injection layer and α-NPD (4,4'-bis[N-(1-naphthyl)-N-phenylamino] biphenyl) (40 nm) as a hole transport layer in this order.

Next, a light emitting layer having a thickness of 40 nm was provided by vapor co-evaporation of 1,3-Bis (N-carbazolyl) benzene (mCP), which is a host compound, and compound B3 of the present invention as a light emitting dopant, at the ratio of mCP:B3=100:5.

Next, BPhen (4,7-diphenyl-1,10-phenanthroline) (30 nm) as an electron transport layer, lithium fluoride (1.0 nm) as an electron injection layer, and aluminum (100 nm) as a cathode were vapor-evaporated in this order to manufacture an organic EL device.

When a constant current of 2.5 mA/cm$^2$ was passed through the obtained organic EL element at room temperature, light derived from the blue fluorescent emission of B3 was emitted. From these results, it was confirmed that B3 of the present invention functions as a light emitting material in the organic EL element.

Further, the luminance was measured immediately after the start of light emission and after 10 hours under the constant current condition of 2.5 mA/cm$^2$ at a temperature of 60° C. from the obtained organic EL element. No significant difference was observed in the emission luminance. From these results, it was confirmed that the organic EL element using B3 of the present invention as a light emitting material has high durability.

9. Example 7

Application Example in Organic Thin Film Solar Cell

An organic thin film solar cell (organic photoelectric conversion element) was manufactured using the compound B3 of the present invention as an n-type material.

Manufacture of Organic Photoelectric Conversion Element

A glass substrate having an ITO (Indium Tin Oxide) layer of 100 nm as an anode was subjected to ultrasonic cleaning with isopropyl alcohol, drying with dry nitrogen gas, and UV ozone cleaning, and fixed on a substrate holder in a vacuum vapor evaporation apparatus.

After evacuating the interior of the vacuum vapor evaporation apparatus to a vacuum degree of $1\times10^{-4}$ Pa, a bulk heterojunction layer having a thickness of 400 nm was provided on the anode by co-evaporation of phthalocyanine ($H_2PC$) and the compound B3 of the present invention at the ratio of $H_2CP:B3=1:1$.

Subsequently, aluminum (100 nm) as a cathode were vapor-evaporated to manufacture an organic photoelectric conversion element.

When the obtained organic photoelectric conversion element was irradiated with light having an intensity of 100 mW/cm$^2$ from a solar simulator, a photocurrent was observed. From this result, it was confirmed that B3 of the present invention functions as an n-type material in the organic photoelectric conversion element.

Further, the obtained organic photoelectric conversion element was placed in a thermostatic chamber at a temperature of 80° C. The calculated photoelectric conversion efficiency after 20 hours was not significantly different from the value before putting into the thermostatic bath. From this result, it was confirmed that the organic EL element using B3 of the present invention has high heat resistance.

10. Example 8

Application Example as an Organic Thin Film Transistor

An organic thin film transistor was manufactured using the compound B3 of the present invention as an n-type material.

Manufacture of Organic Transistor Element

Figure 4:
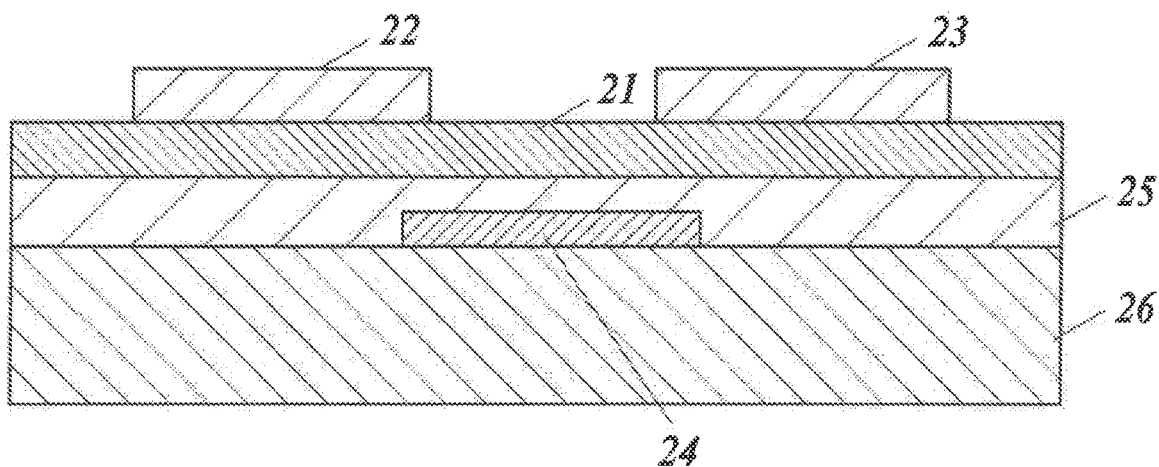

An organic thin film transistor element having the layer structure illustrated in FIG. 4 was manufactured.

First, as a gate electrode 24, a thermal oxide layer having a thickness of 2000 Å was formed on a silicon wafer to form a gate insulating layer 25. Hereinafter, this is called a substrate.

A 0.1% toluene solution of compound B3 of the present invention was dropped onto the substrate heated under a nitrogen atmosphere on a hot plate, to form a coating layer (thickness: 50 nm) of an active layer 21. Further, gold was vapor-evaporated on the active layer 21 using a mask to form a source electrode 22 and a drain electrode 23, so that an organic thin film transistor was manufactured.

It was confirmed that the obtained organic thin film transistor exhibited transistor characteristics of n-channel driving.

11. Example 9

Application Example as Transparent Electrode

Figure 5:
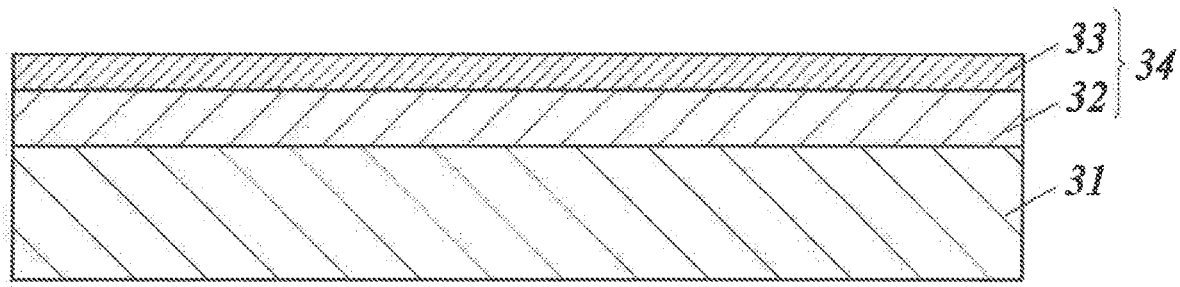

A transparent electrode illustrated in FIG. 5 was manufactured using the compound B3 of the present invention as an intermediate layer material.

Manufacture of Transparent Electrode

A transparent non-alkali glass substrate 31 was fixed on a holder in a vacuum deposition apparatus. After evacuating the interior of the vacuum deposition apparatus to a vacuum degree of $1\times10^{-4}$ Pa, the compound B3 of the present invention was evaporated on the substrate to a thickness of 30 nm, to form an intermediate layer 32.

Subsequently, a heating boat containing silver was heated by electric current to form a conductive layer 33 of silver having a layer thickness of 10 nm within an evaporation rate of 0.1 to 0.2 nm/sec. A transparent electrode 34 made of the intermediate layer 32 and the conductive layer 33 was thereby manufactured.

The sheet resistance value and the light transmittance at a wavelength of 550 nm measured from the obtained transparent electrode were 20 Ω/□ and 60%. From this result, it was confirmed that B3 of the present invention functions as an intermediate layer material in the transparent electrode.

Although embodiments of the present invention have been described and illustrated in detail, the disclosed embodiments are made for purposes of illustration and example only and not limitation. The scope of the present invention should be interpreted by terms of the appended claims

INDUSTRIAL APPLICABILITY

The π-conjugated boron compound of the present invention is a π-conjugated boron compound in which a boron atom is bonded to three aromatic groups via three boron-carbon bonds, wherein bond distances of the three boron-carbon bonds are all 1.48 Å or less. The π-conjugated boron compound is a novel π-conjugated boron compound in which bonds between the boron atom and the carbon atoms are strengthened. By including the π-conjugated boron compound in the organic functional layer, an electronic device having high durability and high electron conductivity can be provided, such as an organic electroluminescence device, a photoelectric conversion device, and a thin film transistor.

DESCRIPTION OF REFERENCE NUMERALS

1 Organic EL element
2 Transparent substrate
3 Anode
4 Hole injection layer
5 Hole transport layer
6 Light emitting layer
7 Electron transport layer
8 Electron injection layer
9 Cathode
F Organic functional layer
R Recombination
L Light
10 Organic photoelectric conversion element of a bulk heterojunction type
11 Substrate
12 Transparent electrode (Anode)
13 Counter electrode (Cathode)
14 Photoelectric conversion portion (Bulk heterojunction layer)
17 Hole transport layer
18 Electron transport layer
21 Active layer
22 Source electrode
23 Drain electrode
24 Gate electrode
25 Insulating layer
26 Support
31 Substrate
32 Intermediate layer
33 Conductive layer
34 Transparent electrode

The invention claimed is:

1. A method for producing a triarylborane, comprising:

producing a triarylborane having a structure represented by following Formula (3) from a triarylborane intermediate having a structure represented by following Formula (2):

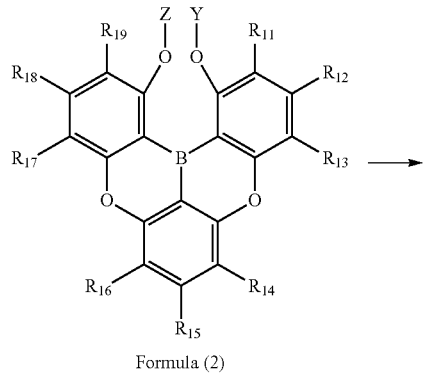

Formula (2)

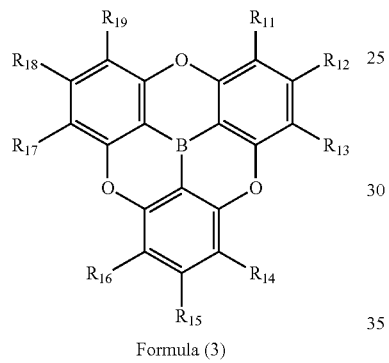

Formula (3)

wherein Y and Z each independently represent a hydrogen atom, a methyl group, or a protecting group for a hydroxy group; and $R_{11}$ to $R_{19}$ each independently represent a hydrogen atom, a chain alkyl group, a ring alkyl group, an alkoxy group, an aryloxy group, an ester group, a cyano group, an alkylamino group, an arylamino group, an aromatic hydrocarbon ring group, or an aromatic heterocyclic group.

2. The method for producing a triarylborane according to claim 1, wherein, in the Formula (2), Y represents a hydrogen atom and Z represents a trifluoromethanesulfonate group.

3. A method for producing a triarylborane intermediate, comprising:

producing a triarylborane intermediate represented by following Formula (5) from a compound having a structure represented by following Formula (4):

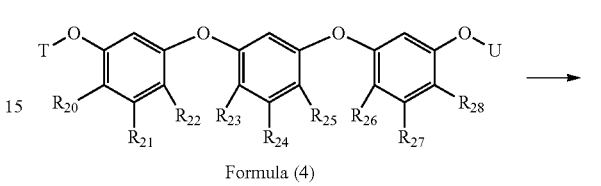

Formula (4)

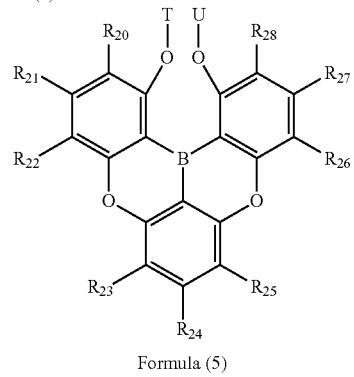

Formula (5)

wherein T and U each independently represent a hydrogen atom, a methyl group, or a protecting group for a hydroxy group; and $R_{20}$ to $R_{28}$ each independently represent a hydrogen atom, a chain alkyl group, a ring alkyl group, an alkoxy group, an aryloxy group, an ester group, a cyano group, an alkylamino group, an arylamino group, an aromatic hydrocarbon ring group, or an aromatic heterocyclic group.

4. The method for producing a triarylborane intermediate according to claim 3, wherein, in the Formula (4) and Formula (5), T and U both represent a methyl group.

* * * * *